United States Patent
Okamoto et al.

(10) Patent No.: US 11,942,494 B2
(45) Date of Patent: Mar. 26, 2024

(54) IMAGING DEVICE

(71) Applicant: SONY SEMICONDUCTOR SOLUTIONS CORPORATION, Kanagawa (JP)

(72) Inventors: Hideo Okamoto, Kanagawa (JP); Makoto Murai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 777 days.

(21) Appl. No.: 17/043,373

(22) PCT Filed: Mar. 20, 2019

(86) PCT No.: PCT/JP2019/011731
§ 371 (c)(1),
(2) Date: Sep. 29, 2020

(87) PCT Pub. No.: WO2019/193977
PCT Pub. Date: Oct. 10, 2019

(65) Prior Publication Data
US 2021/0028210 A1    Jan. 28, 2021

(30) Foreign Application Priority Data

Apr. 4, 2018   (JP) .................... 2018-072072

(51) Int. Cl.
*H01L 27/146* (2006.01)
*H04N 23/54* (2023.01)
*H04N 23/55* (2023.01)

(52) U.S. Cl.
CPC ....... *H01L 27/14618* (2013.01); *H04N 23/54* (2023.01); *H04N 23/55* (2023.01)

(58) Field of Classification Search
None
See application file for complete search history.

(56) References Cited

U.S. PATENT DOCUMENTS

| | | |
|---|---|---|
| 2017/0217383 A1 | 8/2017 | Bingle |
| 2017/0276895 A1 | 9/2017 | Sakuma et al. |
| 2017/0280558 A1* | 9/2017 | Ohara ............. G03B 17/55 |

FOREIGN PATENT DOCUMENTS

| | | |
|---|---|---|
| CN | 101472046 A | 7/2009 |
| CN | 100534148 C | 8/2009 |

(Continued)

OTHER PUBLICATIONS

International Search Report and Written Opinion of PCT Application No. PCT/JP2019/011731, dated Jun. 18, 2019, 07 pages of ISRWO.

*Primary Examiner* — Bo B Jang
(74) *Attorney, Agent, or Firm* — CHIP LAW GROUP

(57) ABSTRACT

An imaging device that includes a wiring substrate, an image sensor package mounted on the wiring substrate, a package frame attached to a light receiving surface side of the image sensor package, and a lens holder arranged to cover the package frame and holding a lens unit so that the lens unit faces the light receiving surface of the image sensor package. The package frame includes a material having a larger coefficient of linear expansion than a material of the lens holder, and includes a wall portion that extends in a direction perpendicular to the wiring substrate toward the wiring substrate. A gap is provided between the wall portion of the package frame and the image sensor package, and between an end of the wall portion of the package frame and the wiring substrate. The lens holder includes a wall portion facing the wall portion of the package frame. An end of the wall portion of the lens holder is fixed to the end of the wall portion of the package frame while being separated from the wiring substrate.

14 Claims, 22 Drawing Sheets

(56) References Cited

FOREIGN PATENT DOCUMENTS

| | | | |
|---|---|---|---|
| CN | 101578854 | A | 11/2009 |
| CN | 102547101 | A | 7/2012 |
| CN | 103765865 | A | 4/2014 |
| CN | 102446935 | B | 8/2016 |
| CN | 106842481 | A | 6/2017 |
| JP | 2011-171866 | A | 9/2011 |
| JP | 5341266 | B2 | 11/2013 |
| JP | 2017-083816 | A | 5/2017 |
| TW | 200740202 | A | 10/2007 |

\* cited by examiner

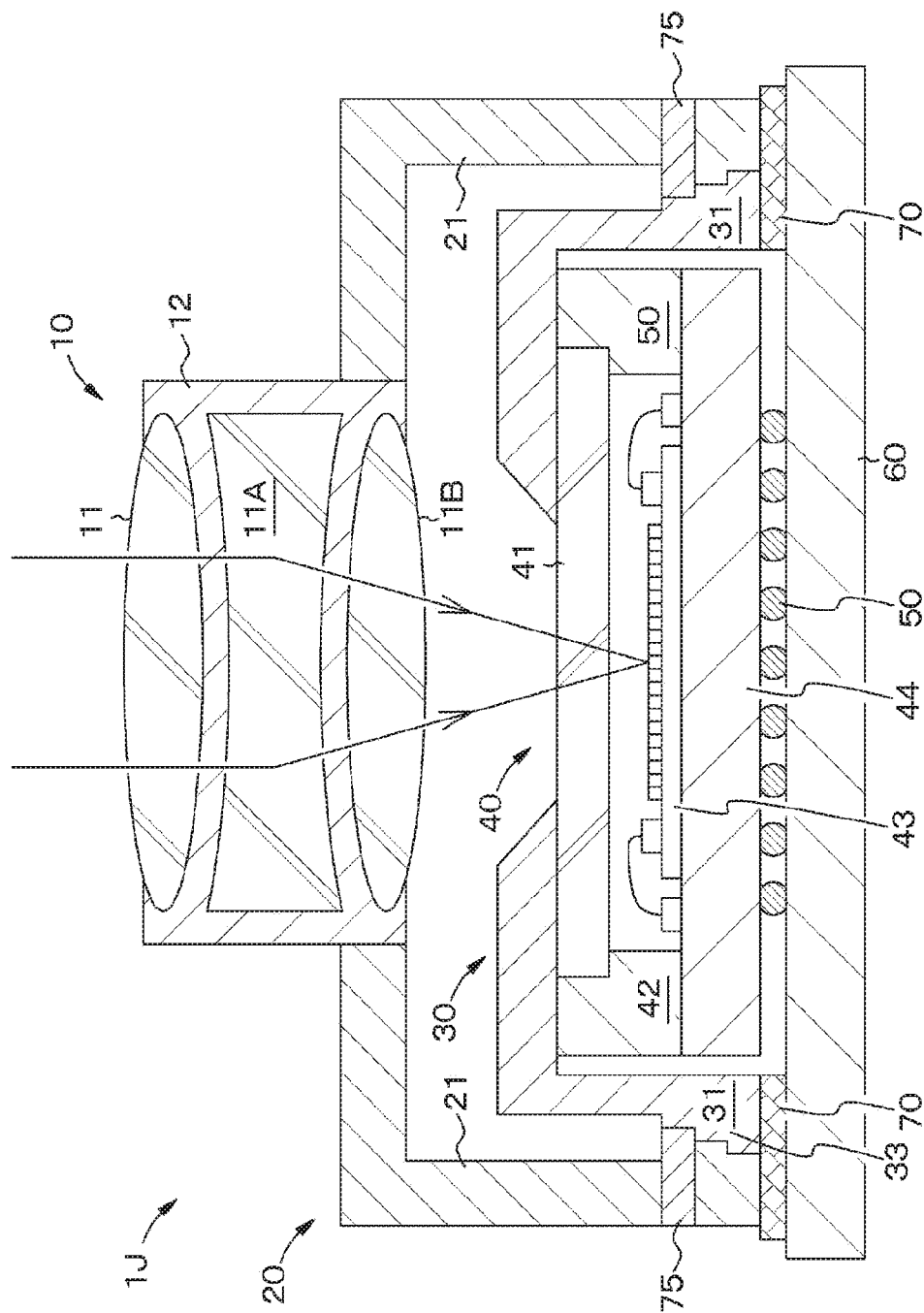

IMAGING DEVICE

CROSS REFERENCE TO RELATED APPLICATIONS

This application is a U.S. National Phase of International Patent Application No. PCT/JP2019/011731 filed on Mar. 20, 2019, which claims priority benefit of Japanese Patent Application No. JP 2018-072072 filed in the Japan Patent Office on Apr. 4, 2018. Each of the above-referenced applications is hereby incorporated herein by reference in its entirety.

TECHNICAL FIELD

The present disclosure relates to an imaging device. In particular, the present disclosure relates to an imaging device that can curb a focus shift due to temperature change.

BACKGROUND ART

In recent years, imaging devices have been mounted on automobiles to perform sensing processing and detect information on obstacles and the like. An imaging device used for such an application is required to have excellent durability and low cost. For this reason, a fixed-focus type imaging device in which a lens and an image sensor are fixed is often used.

In a fixed-focus type imaging device, a phenomenon may occur in which the focus shifts due to thermal expansion of constituent members and the resolution decreases. Hence, it has been proposed to set the coefficient of linear expansion of a lens holding member and a lead frame in a predetermined relationship to curb the decrease in resolution caused by temperature change (see Patent Document 1).

CITATION LIST

Patent Document

Patent Document 1: Japanese Patent Application Laid-Open No. 2011-171866

SUMMARY OF THE INVENTION

Problems to be Solved by the Invention

Due to demands such as a higher number of pixels, the configuration of an imaging device for in-vehicle use tends to increase in size. With the upsizing of the configuration of the imaging device, the degree of thermal expansion of the constituent members inevitably increases. Hence, there is a demand for a structure that can more effectively curb the decrease in resolution caused by a focus shift due to temperature change.

An object of the present disclosure is to provide an imaging device that can more effectively curb a decrease in resolution caused by a focus shift due to temperature change.

Solutions to Problems

An imaging device according to the present disclosure for achieving the above object is
an imaging device including:
a wiring substrate;
an image sensor package mounted on the wiring substrate;
a package frame attached to a light receiving surface side of the image sensor package; and
a lens holder arranged to cover the package frame and holding a lens unit so that the lens unit faces the light receiving surface of the image sensor package, in which
the package frame includes a material having a larger coefficient of linear expansion than a material of the lens holder, and includes a wall portion that extends in a direction perpendicular to the wiring substrate toward the wiring substrate,
a gap is provided between the wall portion of the package frame and the image sensor package, and between an end of the wall portion of the package frame and the wiring substrate,
the lens holder includes a wall portion facing the wall portion of the package frame, and
an end of the wall portion of the lens holder is fixed to the end of the wall portion of the package frame while being separated from the wiring substrate.

BRIEF DESCRIPTION OF DRAWINGS

FIG. 15 is a schematic cross-sectional view for describing a ninth modification according to the first embodiment.

MODE FOR CARRYING OUT THE INVENTION

Figure 1:
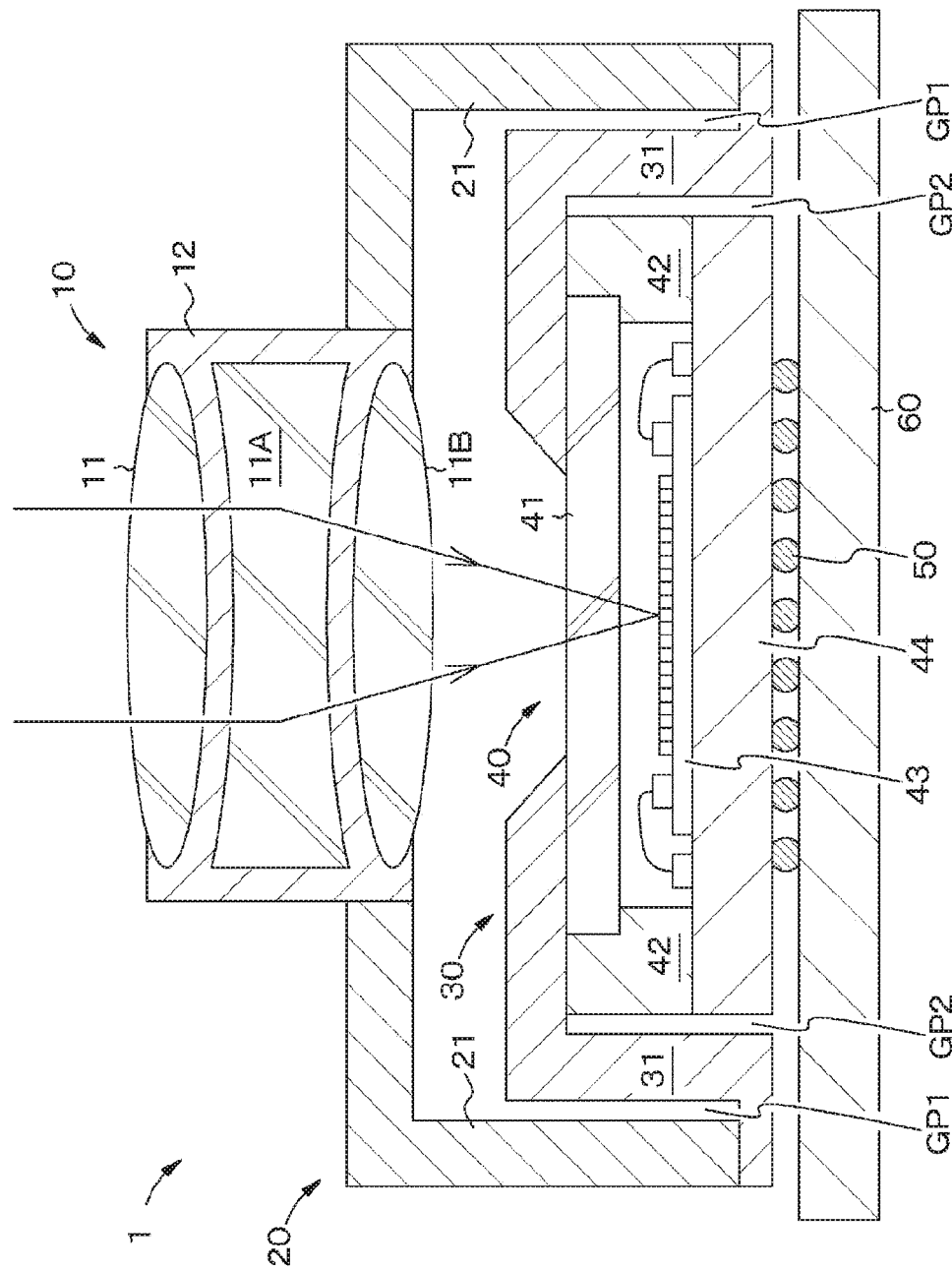
FIG. 1 is a schematic cross-sectional view for describing the structure of an imaging device according to a first embodiment.

Hereinafter, the present disclosure will be described on the basis of embodiments with reference to the drawings. The present disclosure is not limited to the embodiments, and various numerical values and materials in the embodiments are examples. In the following description, the same elements or elements having the same function will be denoted by the same symbols, without redundant description. Note that the description will be given in the following order.

1. Description of imaging device according to present disclosure and general
2. First Embodiment
3. Application Example
4. Configuration of present disclosure Description of Imaging Device According to Present Disclosure and General As described above, the imaging device according to the present disclosure is an imaging device including:
a wiring substrate;
an image sensor package mounted on the wiring substrate;
a package frame attached to a light receiving surface side of the image sensor package; and
a lens holder arranged to cover the package frame and holding a lens unit so that the lens unit faces the light receiving surface of the image sensor package, in which
the package frame includes a material having a larger coefficient of linear expansion than a material of the lens holder, and includes a wall portion that extends in a direction perpendicular to the wiring substrate toward the wiring substrate,
a gap is provided between the wall portion of the package frame and the image sensor package, and between an end of the wall portion of the package frame and the wiring substrate,
the lens holder includes a wall portion facing the wall portion of the package frame, and
an end of the wall portion of the lens holder is fixed to the end of the wall portion of the package frame while being separated from the wiring substrate.

In the imaging device of the present disclosure,
the material of the package frame and a length of the wall portion of the package frame extending in the direction perpendicular to the wiring substrate, and the material of the lens holder and a length of the wall portion of the lens holder extending in the direction perpendicular to the wiring substrate can be selected, so that a distance between the light receiving surface of the image sensor package and the lens unit is kept constant regardless of an ambient temperature.

Alternatively, in the imaging device of the present disclosure,
the material of the package frame and a length of the wall portion of the package frame extending in the direction perpendicular to the wiring substrate, and the material of the lens holder and a length of the wall portion of the lens holder extending in the direction perpendicular to the wiring substrate can be set, so that a distance between the light receiving surface of the image sensor package and the lens unit changes with a predetermined sensitivity according to an ambient temperature. In this case, the change in the distance between the light receiving surface of the image sensor package and the lens unit with the predetermined sensitivity according to the ambient temperature can compensate for an influence of a characteristic change of the lens unit that occurs according to the ambient temperature.

In the imaging device of the present disclosure including the above-described various preferable configurations, the package frame can include a resin material. In particular, it is preferable to select an epoxy resin material having a relatively large coefficient of linear expansion among the resin materials.

In the imaging device of the present disclosure including the above-described various preferable configurations, the lens holder can include a metal material. In particular, it is preferable to select a material such as aluminum or aluminum alloy, which has a relatively small coefficient of linear expansion, among the metal materials.

In the imaging device of the present disclosure including the above-described various preferable configurations, a lens included in the lens unit may include a glass material or a plastic material. Generally, a plastic lens is cheaper than a glass lens, but its optical characteristics change largely with temperature. Even in this case, by performing setting so that the distance between the light receiving surface of the image sensor package and the lens unit changes with a predetermined sensitivity according to the ambient temperature, it is possible to effectively curb deterioration of resolution due to the temperature change.

In the imaging device of the present disclosure including the above-described various preferable configurations, a cushion member can be arranged between the end of the wall portion of the lens holder and the wiring substrate. The cushion member can prevent entry of dust and the like. The cushion member preferably includes a sponge material so as not to hinder the shape change of the package frame due to thermal expansion.

In the imaging device of the present disclosure including the above-described various preferable configurations, the end of the wall portion of the lens holder can be fixed to a surface of a flange provided on the end of the wall portion of the package frame. Alternatively, a side surface near the end of the wall portion of the lens holder can be fixed to a side surface near the end of the wall portion of the package frame, a side surface near the end of the wall portion of the lens holder can be fixed to a side surface near the end of the wall portion of the package frame by a fixing member, or a side surface near the end of the wall portion of the lens holder can be fixed to a side surface near the end of the wall portion of the package frame by fitting. Additionally, a step for setting a mounting position of the lens holder can be provided near the end of the wall portion of the package frame.

The image sensor used in the image sensor package is not particularly limited. For example, it is possible to use an image sensor such as a CMOS sensor or a CCD sensor in which pixels including photoelectric conversion elements and various pixel transistors are arranged in a two-dimensional matrix in the row direction and the column direction.

The image sensor may be configured to capture a monochrome image or may be configured to capture a color image. In the case of capturing a color image, a color filter is usually arranged on the light incident surface side of a photoelectric conversion unit. For example, in the case of capturing a color image in a Bayer array, color imaging is performed using a group of photoelectric conversion elements corresponding to [red, green, green, blue].

While examples of the pixel values of the image sensor include resolutions for image display such as U-XGA (1600, 1200), HD-TV (1920, 1080), Q-XGA (2048, 1536), (3840, 2160), and (7680, 4320), the values are not limited to these values.

Various conditions of the present specification are satisfied not only in a case where the conditions are mathematically strictly established, but also in a case where the conditions are substantially established. Various variations caused by design or manufacturing are permissible. Additionally, drawings used in the following description are schematic, and do not show actual dimensions or the ratio thereof. For example, FIG. 1 to be described later shows a cross-sectional structure of an imaging device, but does not show the ratio of width, height, thickness, and the like.

First Embodiment

A first embodiment relates to an imaging device according to the present disclosure.

FIG. 1 is a schematic cross-sectional view for describing the structure of the imaging device according to the first embodiment.

First, an outline of the imaging device will be described. An imaging device 1 shown in FIG. 1 includes:
- a wiring substrate 60;
- an image sensor package 40 mounted on the wiring substrate 60;
- a package frame 30 attached to the light receiving surface side of the image sensor package 40; and
- a lens holder 20 arranged so as to cover the package frame 30 and holding a lens unit 10 so that the lens unit 10 faces a light receiving surface of the image sensor package 40.

The image sensor package 40 includes a chip-shaped image sensor 43 in which pixels including photoelectric conversion units are arranged in a two-dimensional matrix, a package substrate 44 provided with connection wiring to the image sensor 43, a transparent seal glass 41 arranged on the light receiving surface side of the image sensor 43, a sealing member 42, and the like. The image sensor package 40 is mounted on the wiring substrate 60 by joining the package substrate 44 and the wiring substrate 60 by solder bumps 50.

The package frame 30 includes a material having a larger coefficient of linear expansion than a material of the lens holder 20. Specifically, the lens holder 20 includes a metal material such as aluminum, and the package frame 30 includes an epoxy resin material. The package frame 30 has a coefficient of linear expansion of about several times to ten times that of the lens holder 20, depending on the selected material.

The package frame 30 includes a wall portion 31 that extends in a direction perpendicular to the wiring substrate 60 toward the wiring substrate 60, and a gap is provided between the wall portion 31 of the package frame 30 and the image sensor package 40, and between an end of the wall portion 30 of the package frame 30 and the wiring substrate 60. These gaps are indicated by symbols GP1 and GP2. The package frame 30 has an opening corresponding to the light receiving surface of the image sensor package 40, has a shape that covers the image sensor package 40, and can take various forms. The appearance of the package frame 30 will be described later with reference to later-mentioned FIGS. 16A, 16B, 17A, 17B, 17C, 18A, 18B, 19A, and 19B.

The lens holder 20 includes a wall portion 21 that faces the wall portion 31 of the package frame 30. An end of the wall portion 21 of the lens holder 20 is fixed to the end of the wall portion 31 of the package frame 30 while being separated from the wiring substrate 60. More specifically, the end of the wall portion 21 of the lens holder 20 is fixed to a surface of a flange provided at the end of the wall portion 31 of the package frame 30.

The lens unit 10 held by the lens holder 20 includes lenses 11, 11A, and 11B and a barrel portion 12. The lens included in the lens unit 10 includes a glass material or a plastic material.

Generally, optical characteristics of a lens including a glass material do not change largely by temperature change. In such a case, the material of the package frame 30 and the length of the wall portion of the package frame 30 extending in a direction perpendicular to the wiring substrate 60, and the material of the lens holder 20 and the length of the wall portion of the lens holder 20 extending in a direction perpendicular to the wiring substrate 60 are selected, so that the distance between the light receiving surface of the image sensor package 40 and the lens unit 10 is kept constant regardless of the ambient temperature.

On the other hand, optical characteristics of a lens including a plastic material change largely by temperature change. Usually, the characteristics of the lens change in such a manner that the focal length is extended by thermal expansion. In such a case, the material of the package frame 30 and the length of the wall portion of the package frame 30 extending in a direction perpendicular to the wiring substrate 60, and the material of the lens holder 20 and the length of the wall portion of the lens holder 20 extending in a direction perpendicular to the wiring substrate 60 are set, so that the distance between the light receiving surface of the image sensor package 40 and the lens unit 10 changes with a predetermined sensitivity according to the ambient temperature. Then, the change in the distance between the light receiving surface of the image sensor package 40 and the lens unit 10 with a predetermined sensitivity according to the ambient temperature compensates for the influence of the characteristic change of the lens unit 10 that occurs according to the ambient temperature.

The outline of the imaging device 1 has been described above. Next, in order to facilitate understanding of the present disclosure, first, a problem of the imaging device of a reference example will be described.

Figure 2:
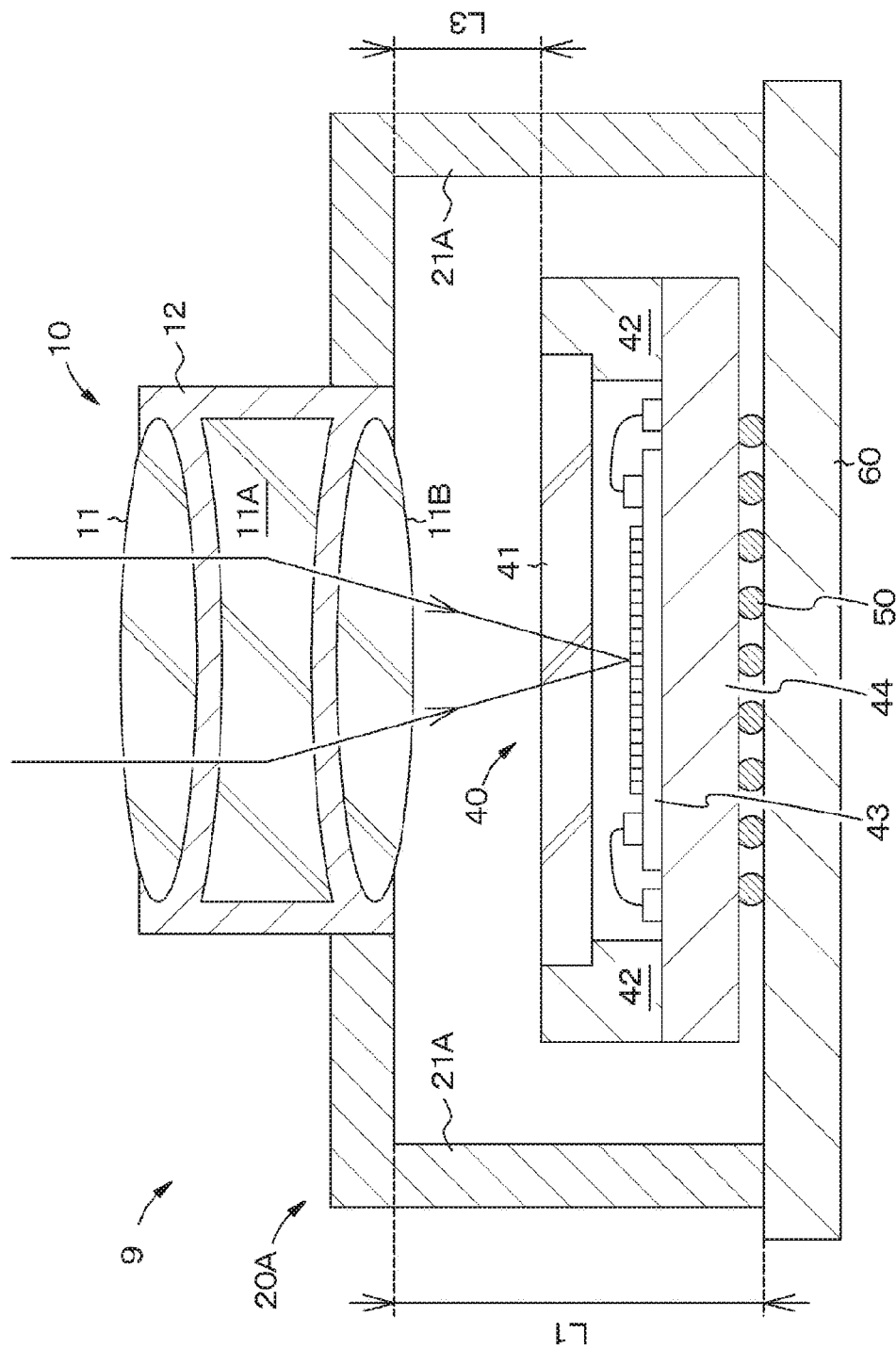
FIG. 2 is a schematic cross-sectional view for describing the structure of an imaging device according to a reference example.
Figure 3:
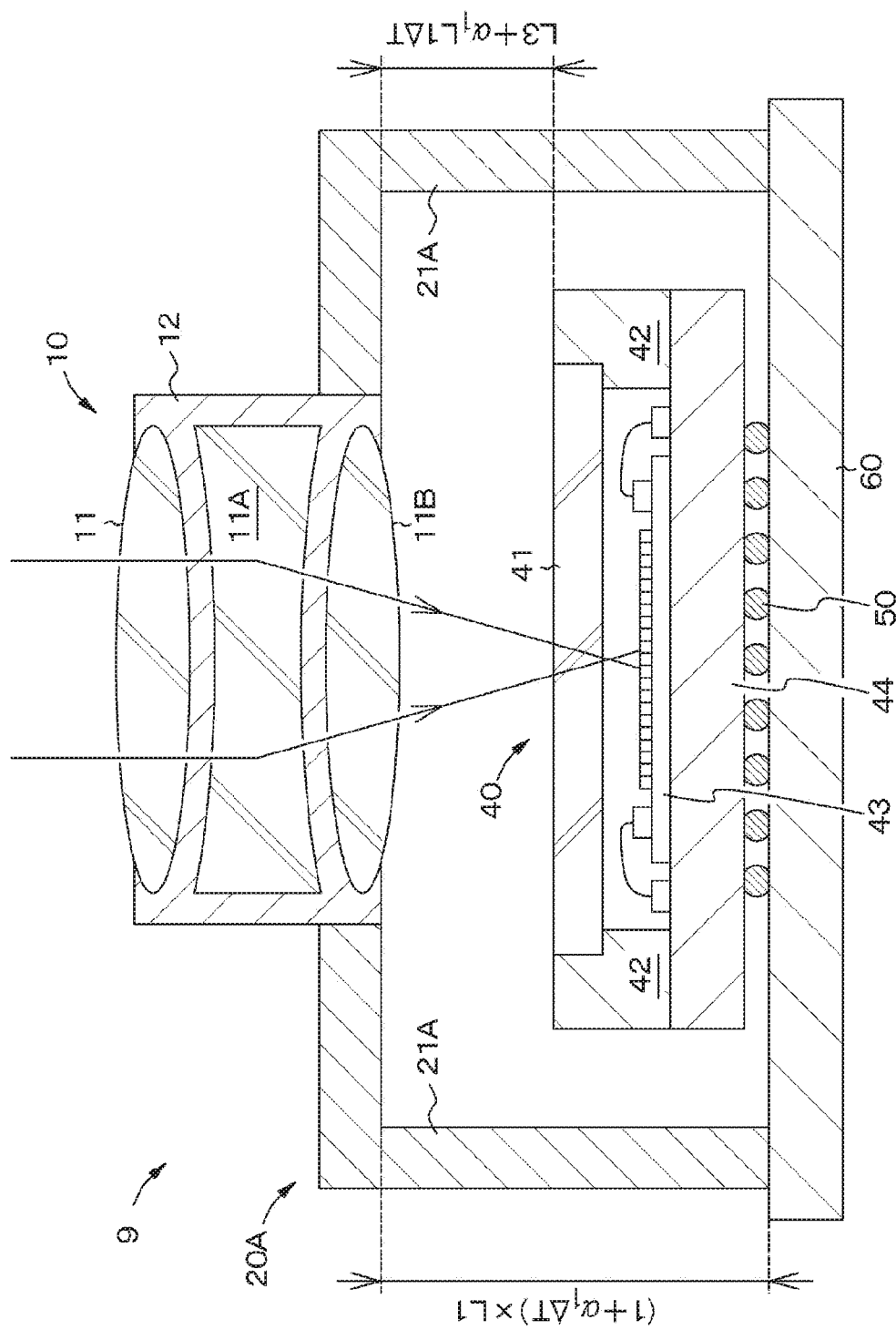
FIG. 3 is a schematic cross-sectional view for describing the influence of thermal expansion in the imaging device according to the reference example.

FIG. 2 is a schematic cross-sectional view for describing the structure of an imaging device according to the reference example. FIG. 3 is a schematic cross-sectional view for describing the influence of thermal expansion in the imaging device according to the reference example.

In an imaging device 9 shown in FIG. 2, an end of a wall portion 21A of a lens holder 20A is fixed to a wiring substrate 60. The length of the wall portion 21A at a certain predetermined reference temperature is indicated by symbol L1, and the distance between a light receiving surface of an image sensor package 40 and the lens unit 10 is indicated by symbol L3. The description will be given on the assumption that focus characteristics are optimized when the positional relationship between an end of the lens unit 10 and the image sensor package 40 is in this state.

In the imaging device 9 shown in FIG. 2, when there is a temperature change indicated by a symbol $\Delta T$ from the certain predetermined reference temperature, the length of the wall portion 21A of the lens holder 20A changes and the resolution of the imaging device 9 decreases. This will be described with reference to FIG. 3.

When the coefficient of linear expansion of the material of the lens holder 20A is indicated by a symbol al, the length of the wall portion 21A is $(1+\alpha_1 \times \Delta T) \times L1$. Accordingly, the distance between the light receiving surface of the image sensor package 40 and the lens unit 10 is $L3+\alpha_1 \times \Delta T \times L1$. Hence, when there is a temperature change indicated by the symbol $\Delta T$, the image sensor package 40 is separated from the lens unit 10 by the amount indicated by $\alpha_1 \times \Delta T \times L1$. For this reason, focus shift occurs and the resolution decreases.

The problem of the imaging device of the reference example has been described above. Subsequently, the configuration of the imaging device 1 will be described in detail. For convenience of description, here, it is assumed that the influence of thermal expansion of the components of the image sensor package can be ignored.

Figure 4:
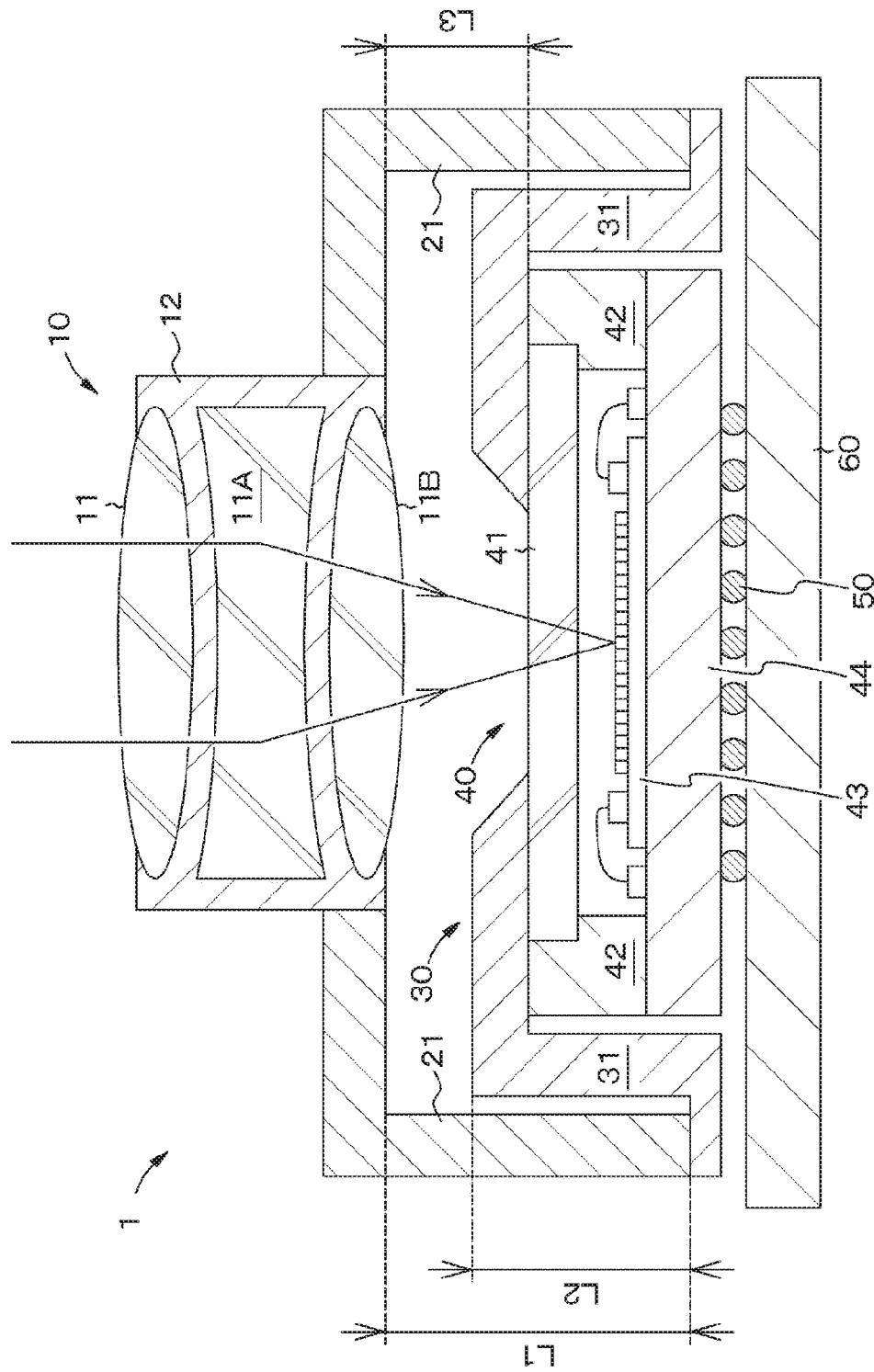
FIG. 4 is a schematic cross-sectional view for describing a state when the imaging device according to the first embodiment is at a reference temperature.

FIG. 4 is a schematic cross-sectional view for describing a state when the imaging device according to the first embodiment is at a reference temperature.

As shown in FIG. 4, in the imaging device 1, at a certain predetermined reference temperature, the length of the wall portion 21 is indicated by a symbol L1, the length of the wall portion 31 is indicated by a symbol L2, and the distance between the light receiving surface of the image sensor package 40 and the lens unit 10 is indicated by a symbol L3. The description will be given on the assumption that focus characteristics are optimized when the positional relationship between an end of the lens unit 10 and the image sensor package 40 is in this state.

Figure 5:
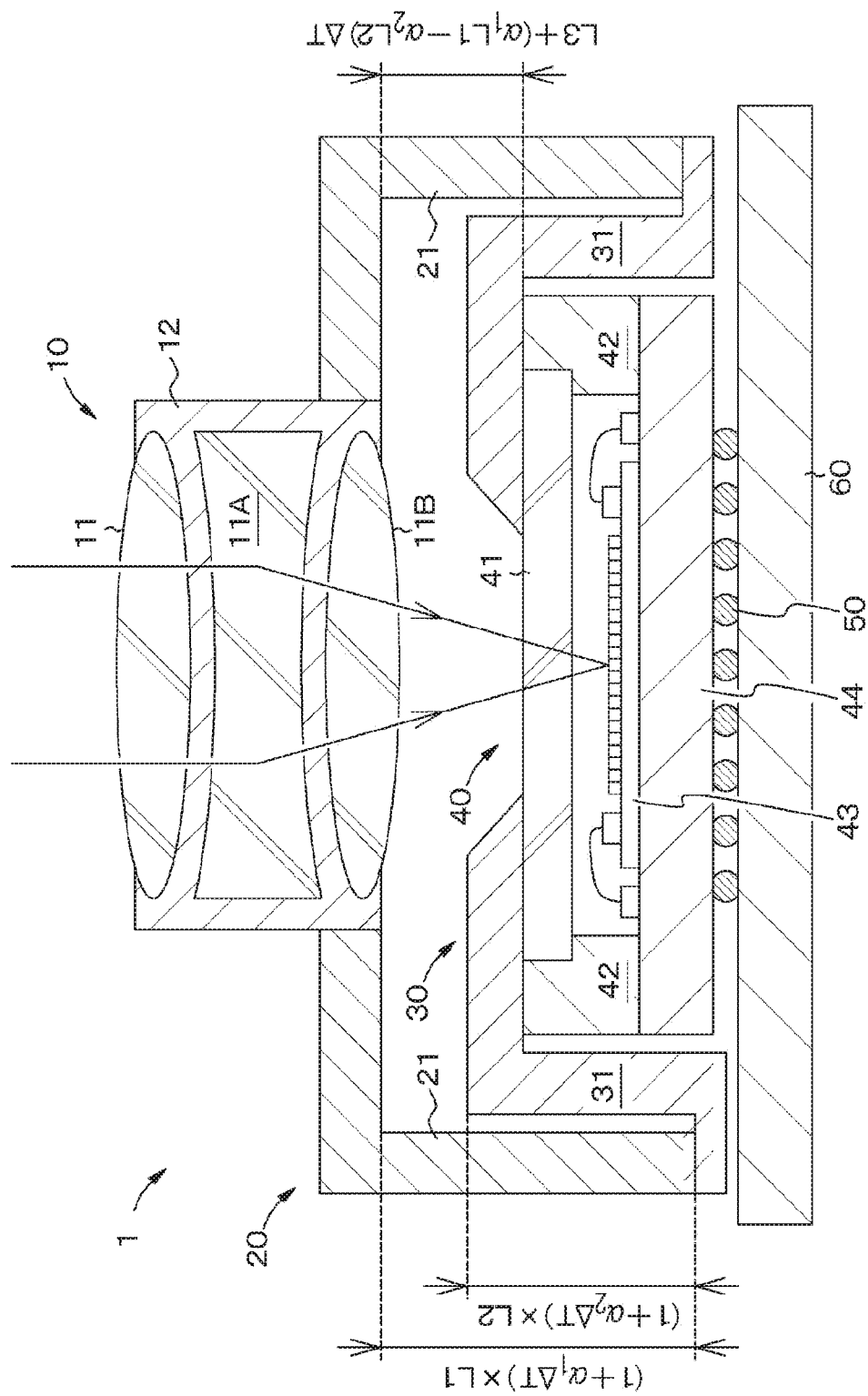
FIG. 5 is a schematic cross-sectional view for describing a state when the temperature of the imaging device according to the first embodiment changes by $\Delta T$ from the reference temperature.

FIG. 5 is a schematic cross-sectional view for describing a state when the temperature of the imaging device according to the first embodiment changes by $\Delta T$ from the reference temperature.

When the coefficient of linear expansion of the material of the lens holder 20A is indicated by a symbol $\alpha_1$, the length of the wall portion 21 is $(1+\alpha_1 \times \Delta T) \times L1$. Additionally, when the coefficient of linear expansion of the material of the package frame 30 is indicated by a symbol $\alpha_2$, the length of the wall portion 31 is $(1+\alpha_1 \times \Delta T) \times L2$. Since the wall portion 31 thermally expands toward the wiring substrate 60, the distance between the light receiving surface of the image sensor package 40 and the lens unit 10 is $L3+(\alpha_1 \times L1 - \alpha_2 \times L2) \times \Delta T$.

Accordingly, when $(\alpha_1 \times L1 - \alpha_2 \times L2)$ is selected to be substantially 0, the distance between the light receiving surface of the image sensor package 40 and the lens unit 10 is kept constant regardless of the ambient temperature. Since optical characteristics of a lens including a glass material usually do not change largely by temperature change, it is preferable that the distance between the light receiving surface of the image sensor package 40 and the lens unit 10 is kept constant.

On the other hand, optical characteristics of a lens including a plastic material change largely by temperature change. First, the characteristic change of the lens unit will be described.

Figure 6:
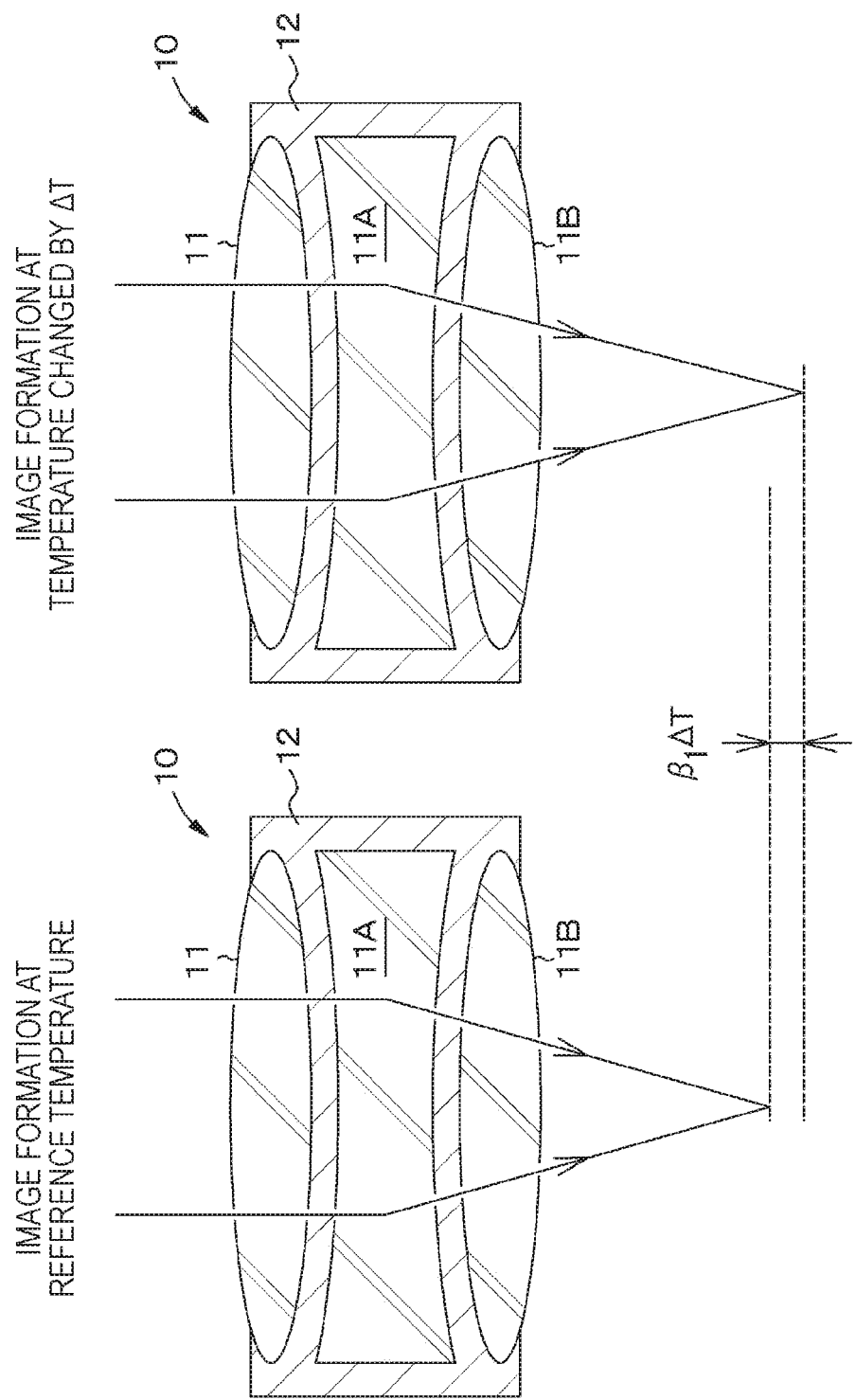
FIG. 6 is a schematic diagram for describing the image formation state of the lens unit at the reference temperature and the image formation state of the lens unit at the temperature changed by $\Delta T$.

FIG. 6 is a schematic diagram for describing the image formation state of the lens unit at the reference temperature and the image formation state of the lens unit at the temperature changed by $\Delta T$.

Usually, in a lens including a plastic material, the focal length tends to become longer as the temperature rises. When the temperature change coefficient of the focal length is indicated by a symbol $\beta_1$, the focal length changes by $\beta_1 \times \Delta T$ when the temperature changes by $\Delta T$ from the reference temperature.

In such a case, when $(\alpha_1 \times L1 - \alpha_2 \times L2)$ is selected to be substantially equal to $\beta 1$, the distance between the light receiving surface of the image sensor package 40 and the lens unit 10 is set so as to change with a predetermined sensitivity according to the ambient temperature. Additionally, the change in the distance between the light receiving surface of the image sensor package 40 and the lens unit 10 with a predetermined sensitivity according to the ambient temperature can compensate for the influence of the characteristic change of the lens unit 10 that occurs according to the ambient temperature. Additionally, in a case where the influence of thermal expansion of the components of the image sensor package 40 cannot be ignored, it is only required to select the values of $(\alpha_1 \times L1 - \alpha_2 \times L2)$ so as to compensate for this characteristic change.

The configuration of the imaging device 1 has been described above in detail. Various modifications can be made in the imaging device 1. Hereinafter, various modifications will be described with reference to the drawings.

Figure 7:
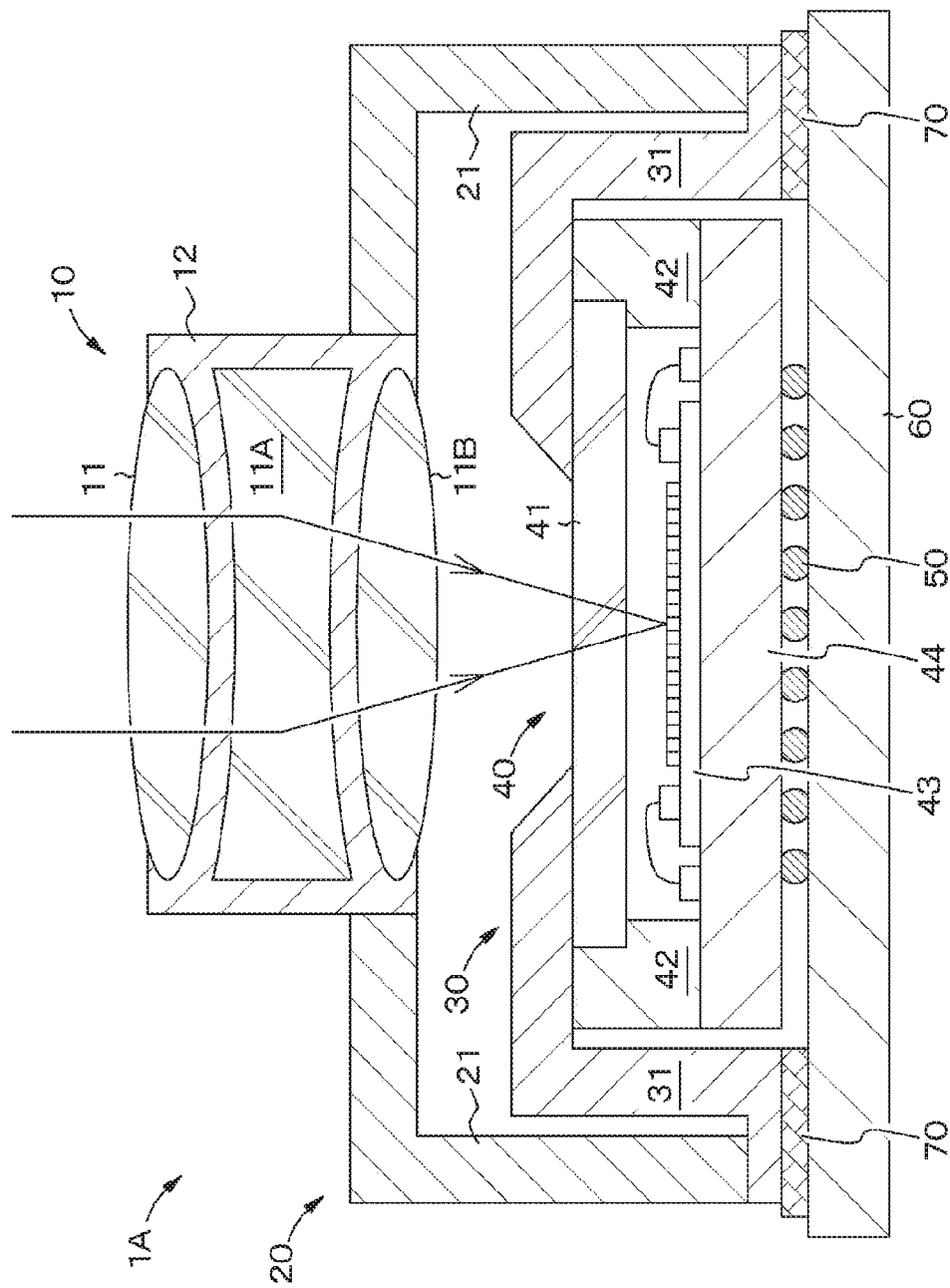
FIG. 7 is a schematic cross-sectional view for describing a first modification according to the first embodiment.

FIG. 7 is a schematic cross-sectional view for describing a first modification according to the first embodiment.

In an imaging device 1A shown in FIG. 7, a cushion member 70 is arranged between an end of a wall portion of a lens holder 20 and a wiring substrate 60. The cushion member 70 includes a sponge material. The cushion member 70 can prevent entry of dust and the like.

Figure 8:
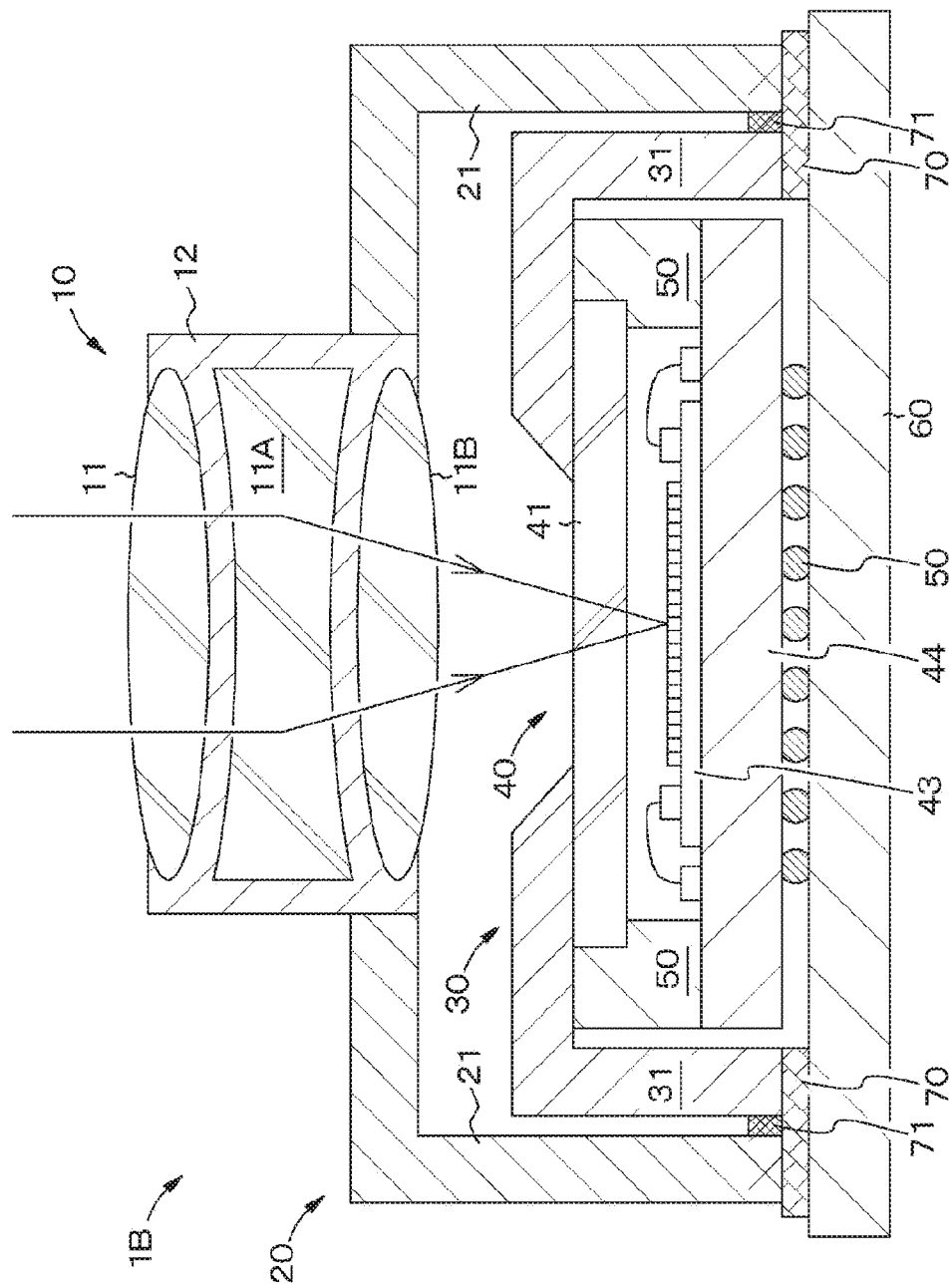
FIG. 8 is a schematic cross-sectional view for describing a second modification according to the first embodiment.

FIG. 8 is a schematic cross-sectional view for describing a second modification according to the first embodiment.

In the imaging device 1 shown in FIG. 1, the end of the wall portion of the lens holder is fixed to the surface of the flange provided at the end of the wall portion of the package frame. On the other hand, in an imaging device 1B shown in FIG. 8, a side surface near an end of a wall portion 21 of a lens holder 20 is fixed to a side surface near an end of a wall portion 31 of a package frame 30. Reference numeral 71 indicates a fixed portion.

Figure 9:
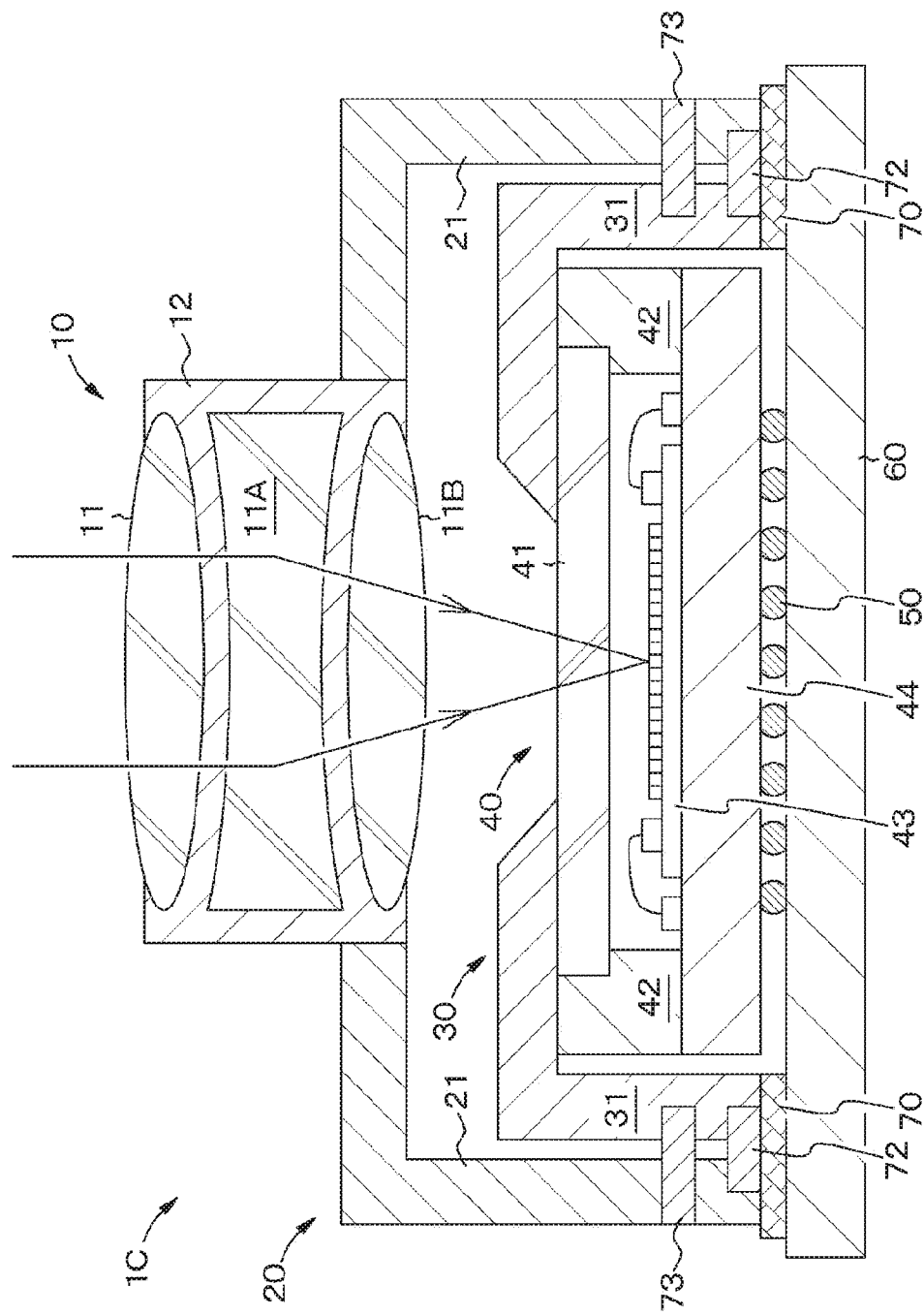
FIG. 9 is a schematic cross-sectional view for describing a third modification according to the first embodiment.

FIG. 9 is a schematic cross-sectional view for describing a third modification according to the first embodiment. In an imaging device 1C shown in FIG. 9, a side surface near an end of a wall portion 21 of a lens holder 20 is fixed to a side surface near an end of a wall portion 31 of a package frame 30 by a fixing member 73. Reference numeral 72 indicates a receiving surface provided on the side surfaces.

Figure 10:
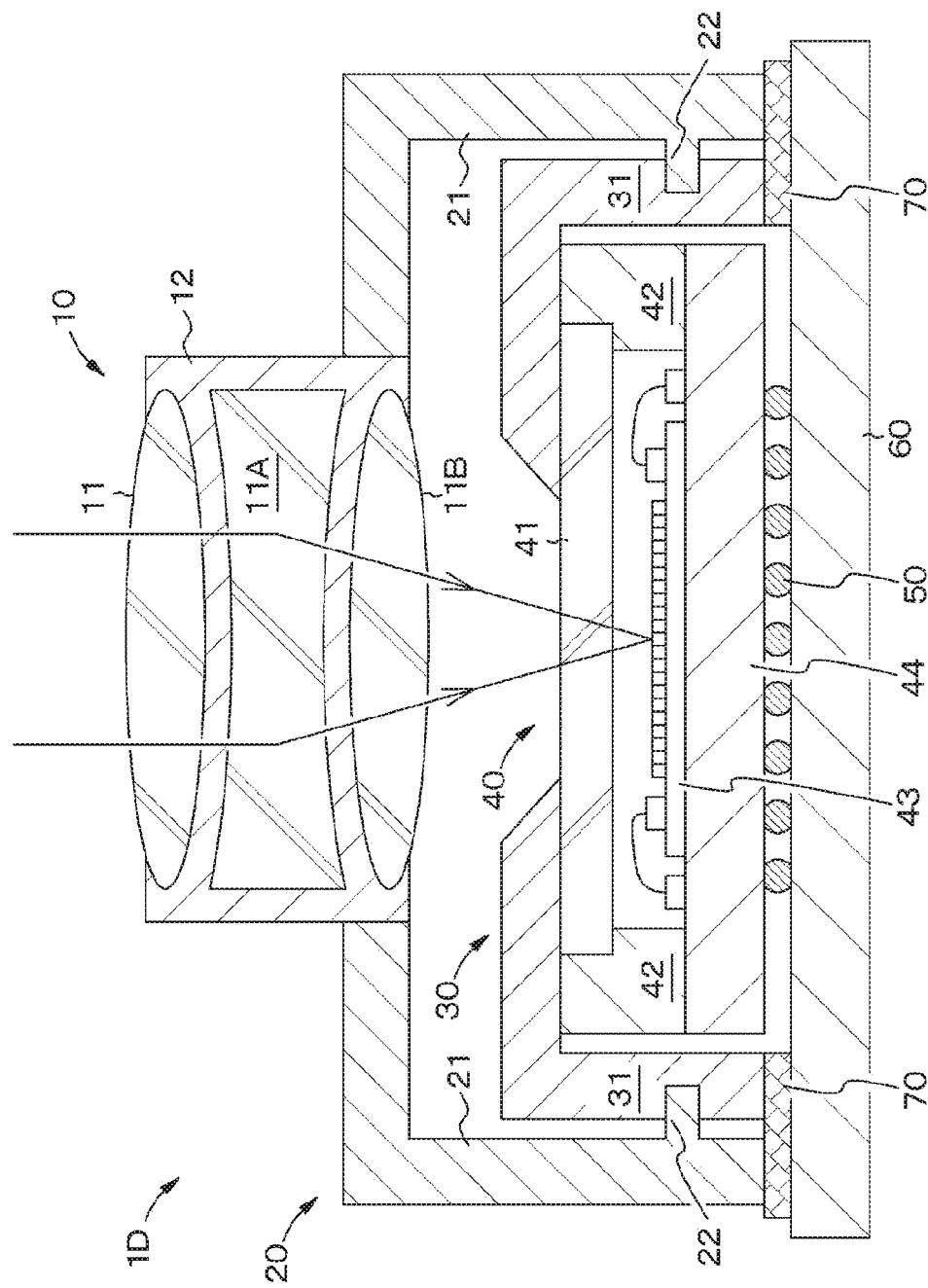
FIG. 10 is a schematic cross-sectional view for describing a fourth modification according to the first embodiment.

FIG. 10 is a schematic cross-sectional view for describing a fourth modification according to the first embodiment. In an imaging device 1D shown in FIG. 10, a side surface near an end of a wall portion 21 of a lens holder 20 is fixed to a side surface near an end of a wall portion 31 of a package frame 30 by fitting. Reference numeral 22 indicates a protrusion provided on the lens holder 20.

Figure 11:
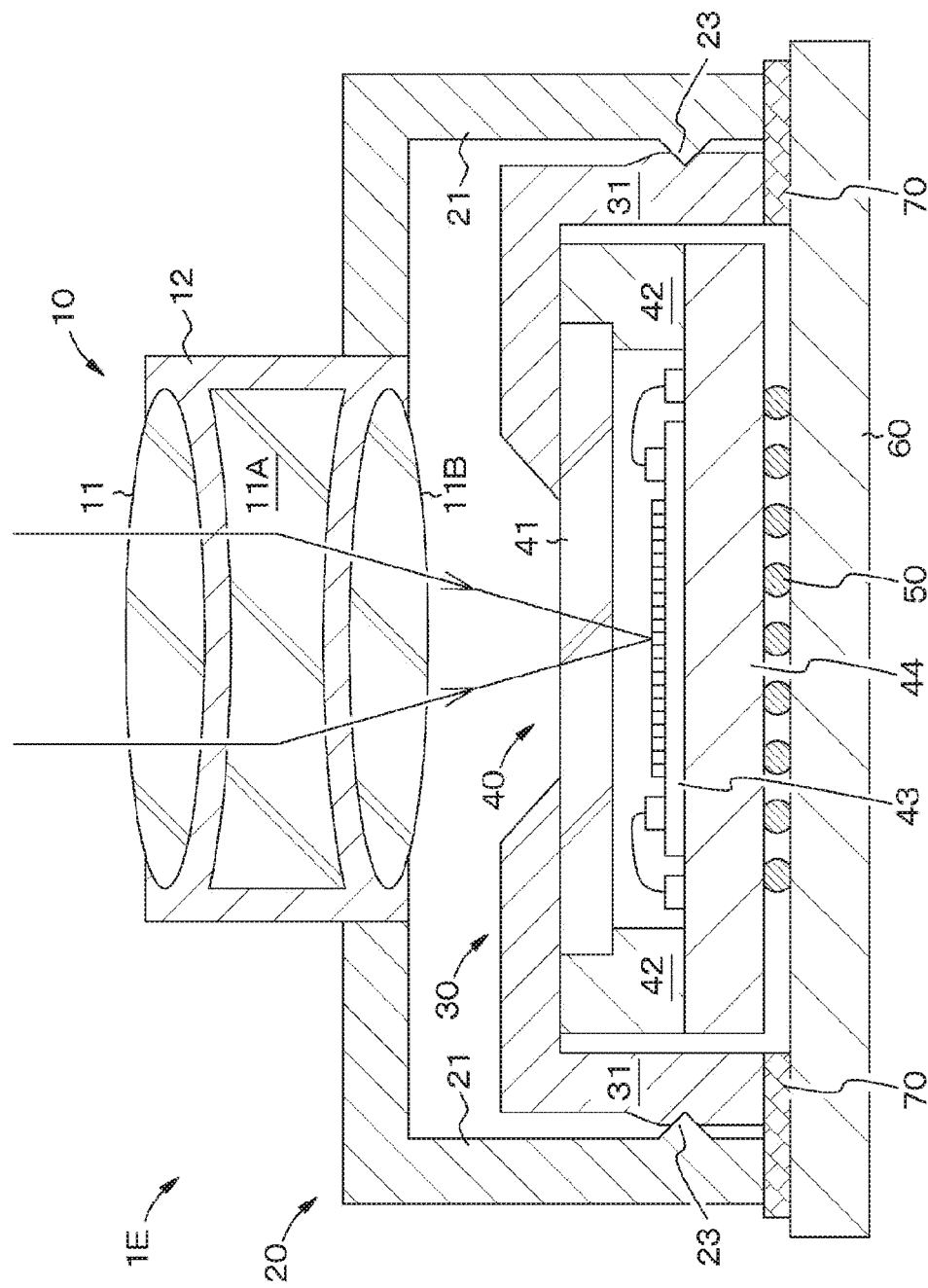
FIG. 11 is a schematic cross-sectional view for describing a fifth modification according to the first embodiment.

FIG. 11 is a schematic cross-sectional view for describing a fifth modification according to the first embodiment. In an imaging device 1E shown in FIG. 11, too, a side surface near an end of a wall portion 21 of a lens holder 20 is fixed to a side surface near an end of a wall portion 31 of a package frame 30 by fitting. The shape of a protrusion 23 from the wall portion 21 and the shape of a recess in the wall portion 31 are shapes that are easier to fit than in FIG. 10.

Figure 12:
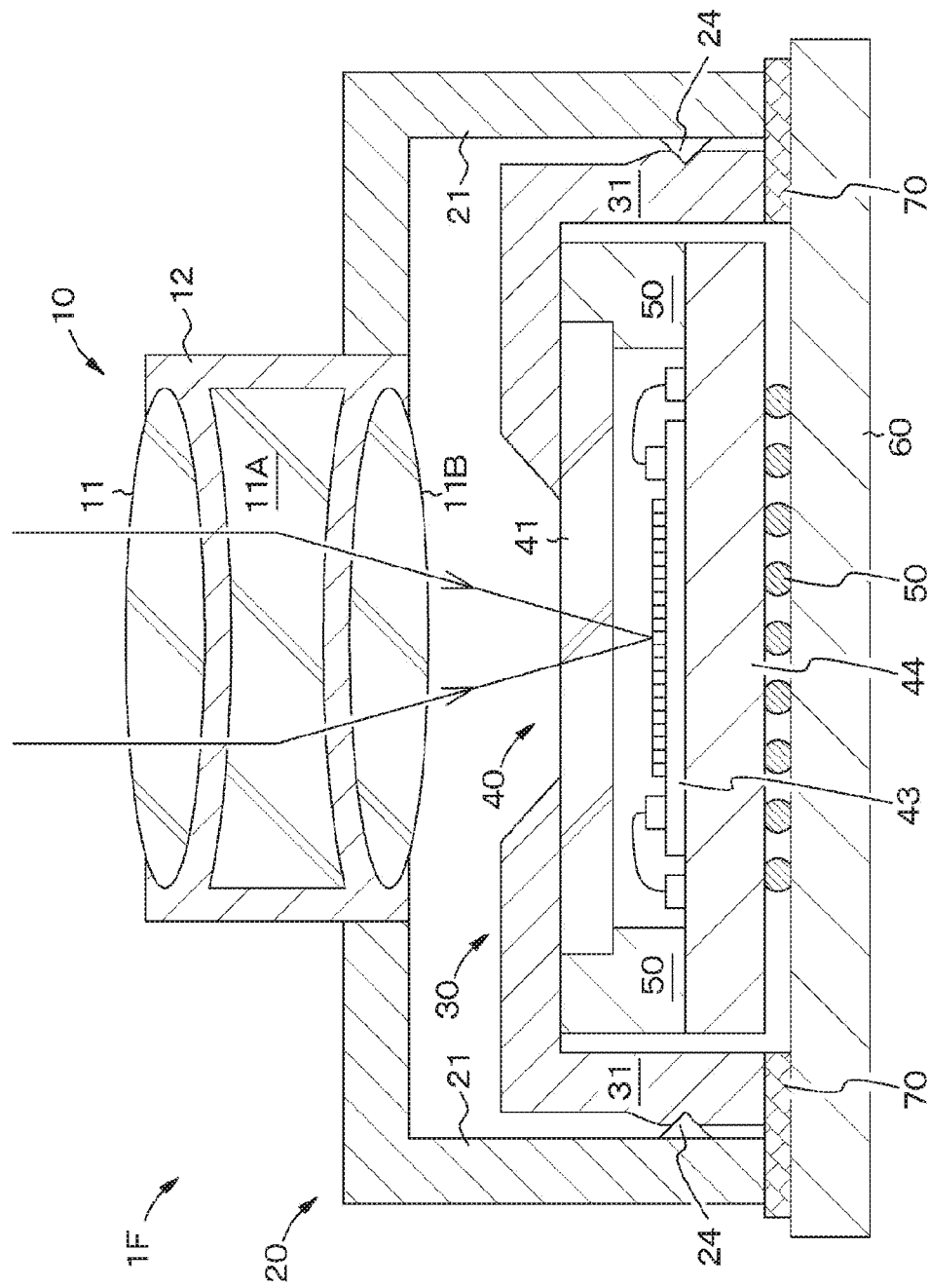
FIG. 12 is a schematic cross-sectional view for describing a sixth modification according to the first embodiment.

FIG. 12 is a schematic cross-sectional view for describing a sixth modification according to the first embodiment. In an imaging device 1F shown in FIG. 12, a positioning groove is formed on a side surface of a wall portion of a package frame 30. Reference numeral 24 indicates a fixed portion positioned by the groove.

Figure 13:
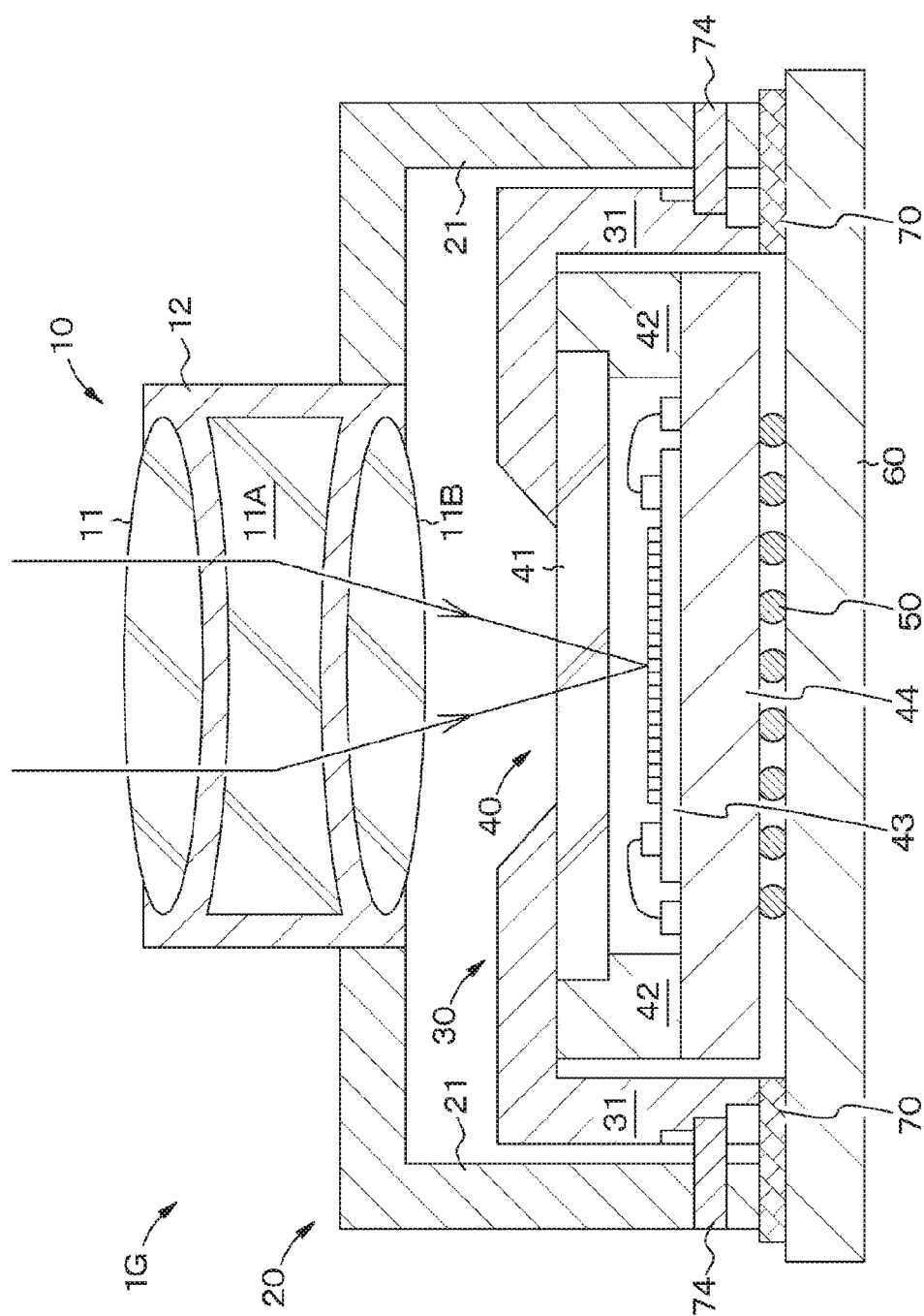
FIG. 13 is a schematic cross-sectional view for describing a seventh modification according to the first embodiment.

FIG. 13 is a schematic cross-sectional view for describing a seventh modification according to the first embodiment. In an imaging device 1G shown in FIG. 13, steps for setting the mounting position of a lens holder 20 are provided near an end of a wall portion 31 of a package frame 30. An optimum step can be selected and fixed according to the design. Reference numeral 74 indicates a fixing member.

Figure 14:
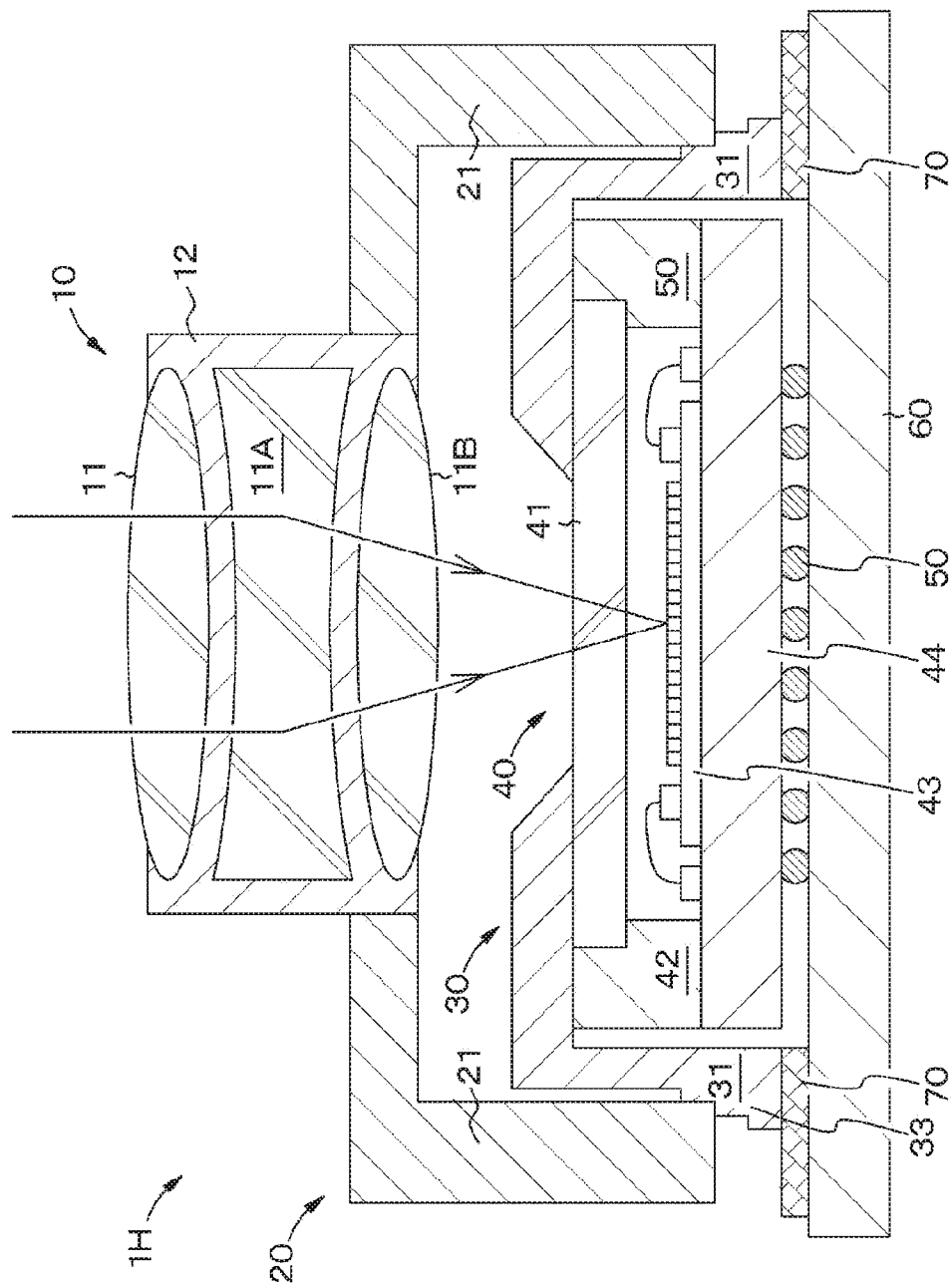
FIG. 14 is a schematic cross-sectional view for describing an eighth modification according to the first embodiment.

FIG. 14 is a schematic cross-sectional view for describing an eighth modification according to the first embodiment. In an imaging device 1H shown in FIG. 14, too, steps for setting the mounting position of a lens holder 20 are provided near an end of a wall portion 31 of a package frame 30. An optimum step can be selected and fixed according to the design.

FIG. 15 is a schematic cross-sectional view for describing a ninth modification according to the first embodiment. In an imaging device 1J shown in FIG. 15, too, steps for setting the mounting position of a lens holder 20 are provided near an end of a wall portion 31 of a package frame 30. An optimum step can be selected and fixed according to the design. Reference numeral 75 indicates a fixing member.

Various modifications have been described above. Next, the appearance of the package frame and the like will be described.

Figure 16A:
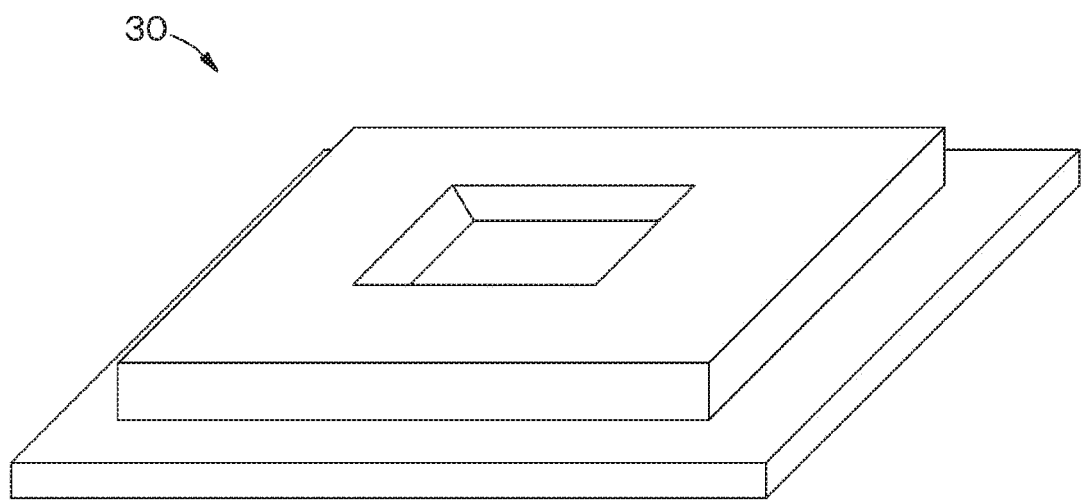
FIGS. 16A and 16B are schematic perspective views for describing the appearance of a package frame.
Figure 16B:
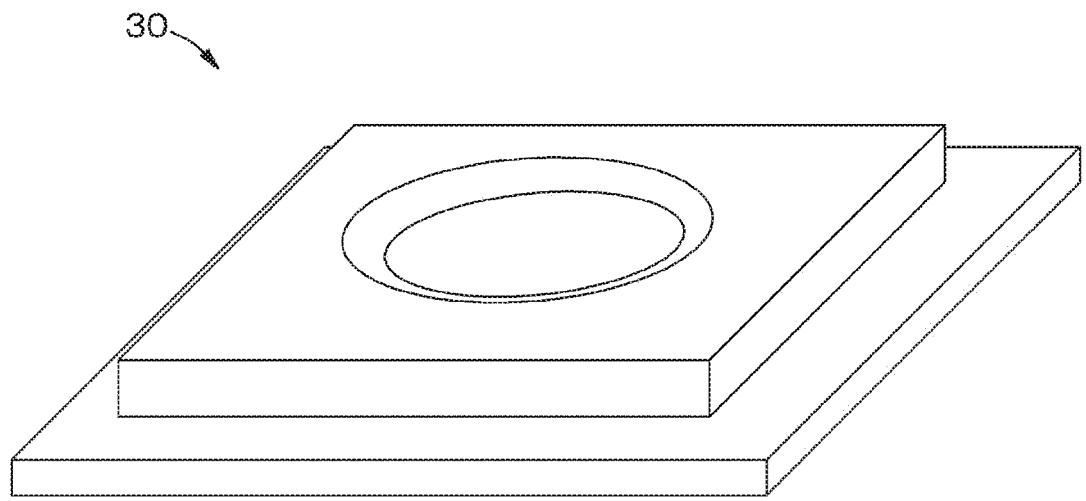

FIGS. 16A and 16B are schematic perspective views for describing the appearance of the package frame.

As described above, the package frame 30 has an opening corresponding to the light receiving surface of the image sensor package 40, and has a shape that covers the image sensor package 40. FIGS. 16A and 16B show an example in which the package frame 30 has a rectangular outer periphery. The opening may be rectangular as in FIG. 16A or circular as in FIG. 16B.

Figure 17A:
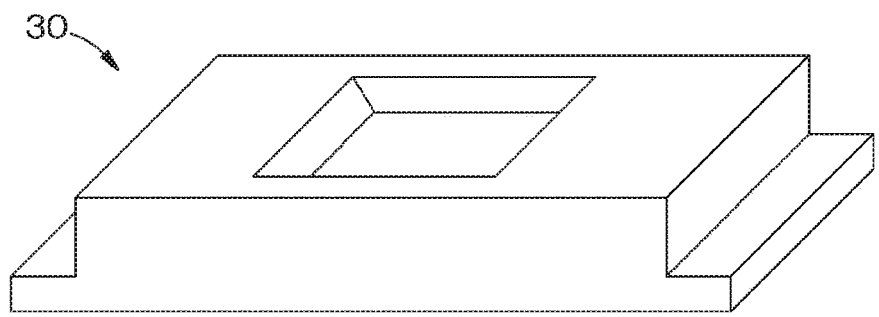
FIGS. 17A, 17B, and 17C are schematic perspective views for describing the appearance of the package frame, following FIG. 16B.
Figure 17B:
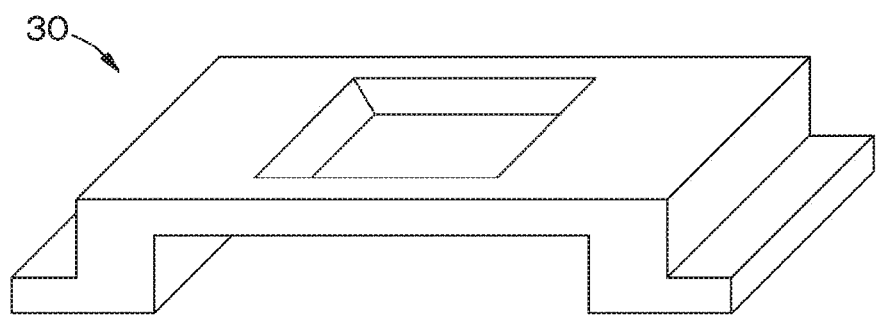
Figure 17C:
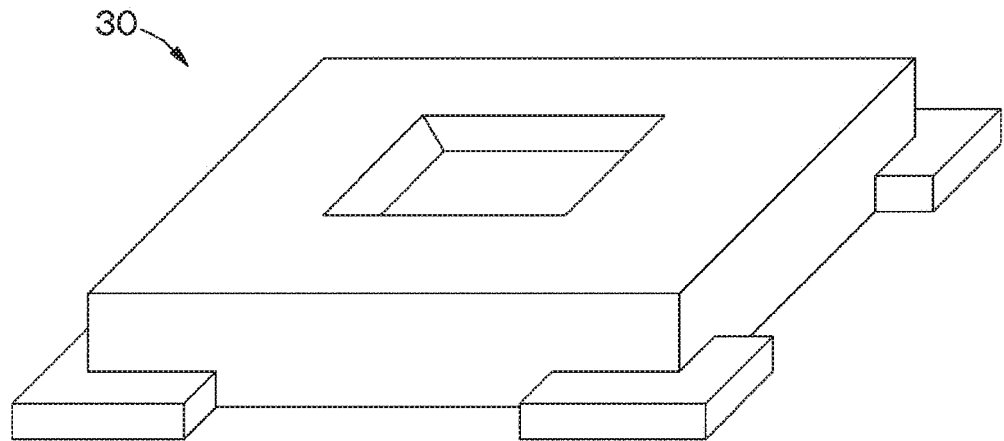

FIGS. 17A, 17B, and 17C are schematic perspective views for describing the appearance of the package frame, following FIG. 16B. In FIGS. 16A and 16B, the flange was provided over the entire outer periphery of the package frame 30. FIGS. 17A, 17B, and 17C show examples in which a flange is provided in a part of the outer periphery.

Figure 18A:
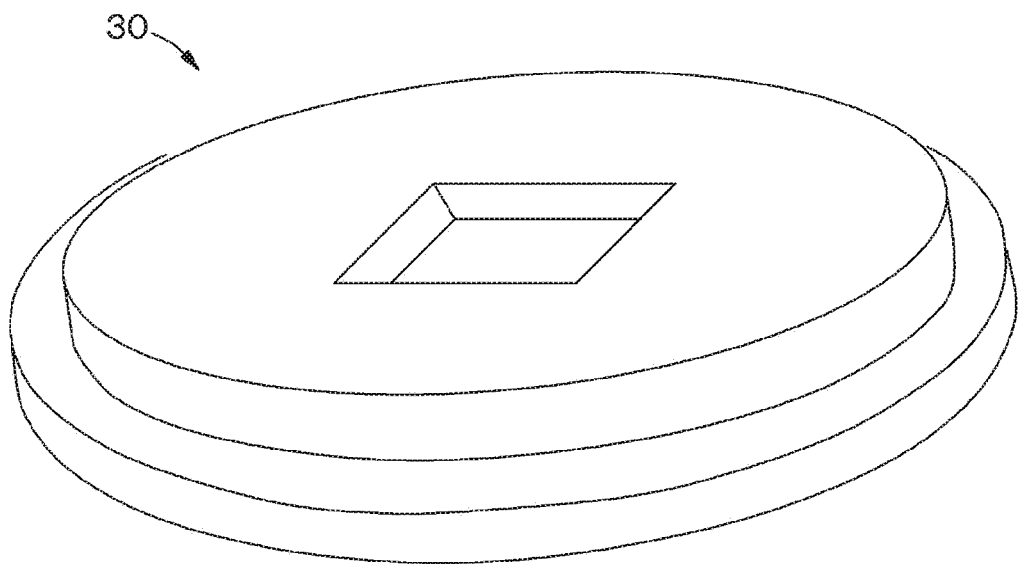
FIGS. 18A and 18B are schematic perspective views for describing the appearance of the package frame, following FIG. 17C.
Figure 18B:
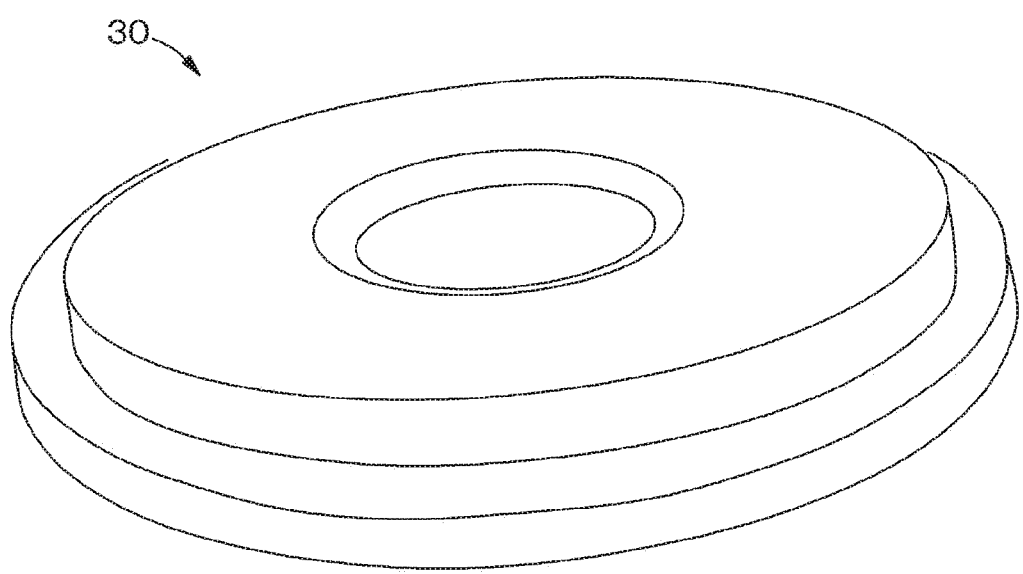

FIGS. 18A and 18B are schematic perspective views for describing the appearance of the package frame, following FIG. 17C. FIGS. 18A and 18B show an example in which the outer periphery of the package frame is circular. The opening may be rectangular as in FIG. 18A or circular as in FIG. 18B.

Figure 19A:
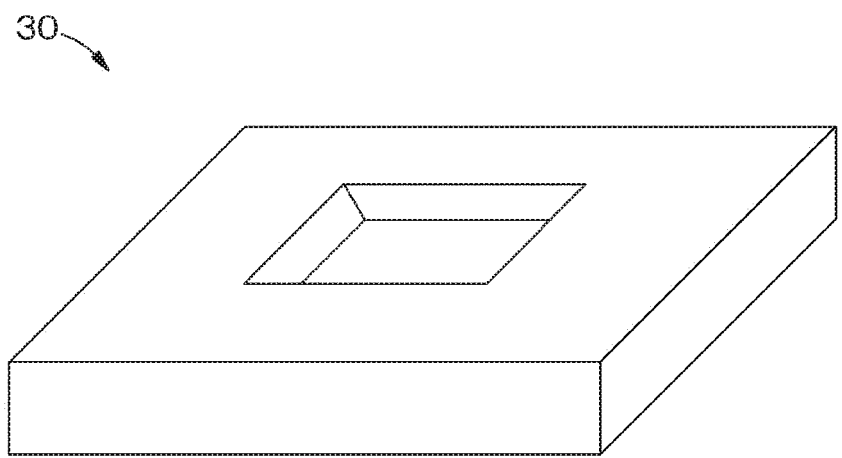
FIGS. 19A and 19B are schematic perspective views for describing the appearance of the package frame, following FIG. 18B.
Figure 19B:
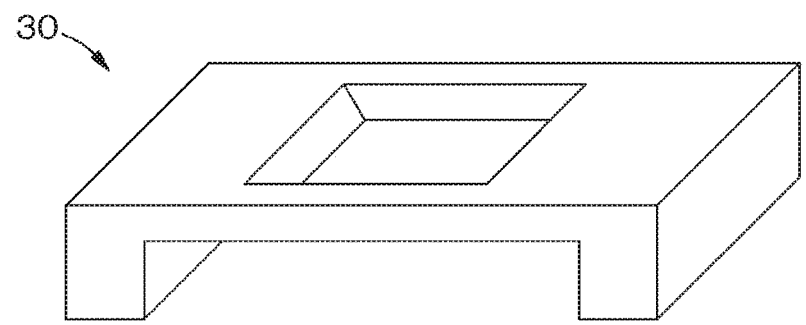

FIGS. 19A and 19B are schematic perspective views for describing the appearance of the package frame, following FIG. 18B. FIGS. 19A and 19B are schematic diagrams illustrating an example of a package frame having no flange.

Figure 20:
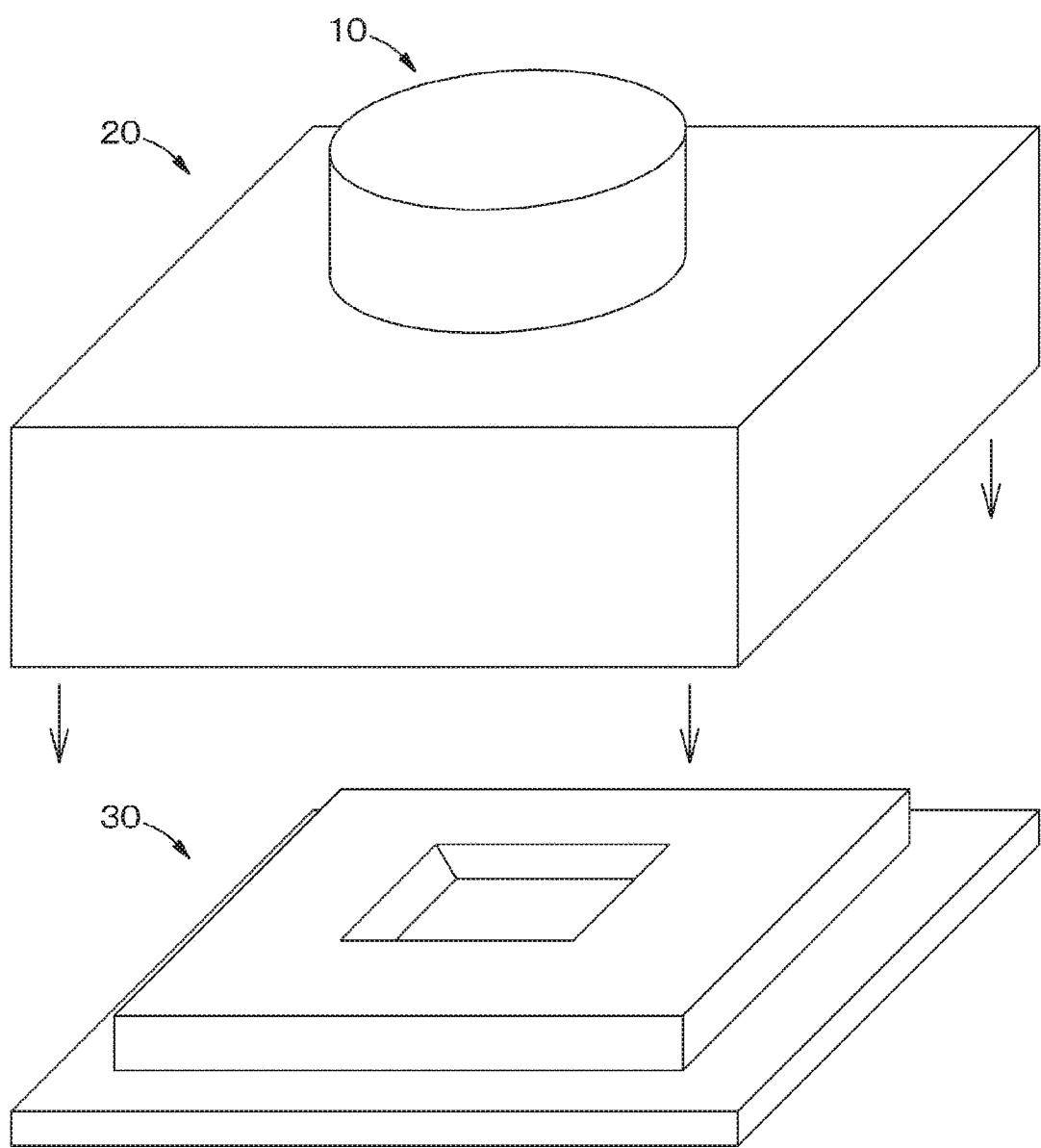
FIG. 20 is a schematic perspective view for describing a joining state of the package frame and a lens frame.

FIG. 20 is a schematic perspective view for describing a joining state of the package frame and the lens holder. FIG. 20 shows an example in which an end of the wall portion of the lens holder is fixed to the surface of the flange provided at an end of the wall portion of the package frame.

In the various imaging devices according to the present disclosure described above, the package frame includes a material having a larger coefficient of linear expansion than the material of the lens holder, and the package frame includes a wall portion that extends in a direction perpendicular to the wiring substrate toward the wiring substrate. A gap is provided between the wall portion of the package frame and the image sensor package, and between the end of the wall portion of the package frame and the wiring substrate. Then, the lens holder includes a wall portion that faces the wall portion of the package frame, and the end of the wall portion of the lens holder is fixed to the end of the wall portion of the package frame while being separated from the wiring substrate. According to this structure, the change in shape due to thermal expansion of the package frame and the lens holder is offset, so that reduction in resolution due to the temperature change can be more effectively curbed.

Application Example

The technology according to the present disclosure can be applied to various products. For example, the technology according to the present disclosure may be implemented as a device mounted on any type of movable bodies including a car, an electric car, a hybrid electric car, a motorcycle, a bicycle, a personal mobility, an airplane, a drone, a ship, a robot, a construction machine, an agricultural machine (tractor), and the like.

Figure 21:
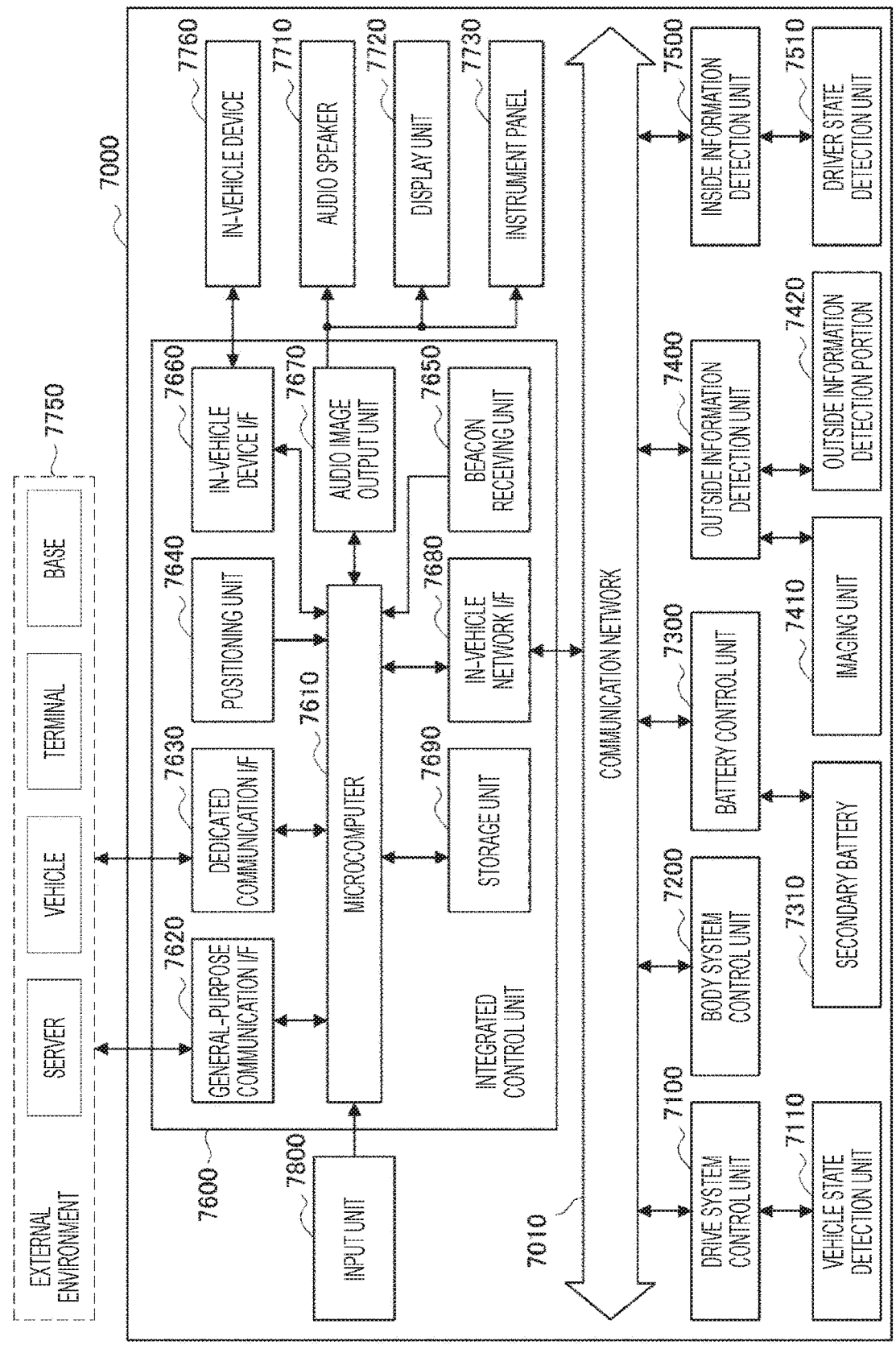
FIG. 21 is a block diagram showing an example of a schematic configuration of a vehicle control system.

FIG. 21 is a block diagram showing a schematic configuration example of a vehicle control system 7000 which is an example of a mobile control system to which the technology according to the present disclosure can be applied. The vehicle control system 7000 includes multiple electronic control units connected through a communication network 7010. In the example shown in FIG. 21, the vehicle control system 7000 includes a drive system control unit 7100, a body system control unit 7200, a battery control unit 7300, an outside information detection unit 7400, an inside information detection unit 7500, and an integrated control unit 7600. The communication network 7010 connecting the multiple control units may be an on-vehicle communication network compliant with an arbitrary standard such as controller area network (CAN), local interconnect network (LIN), local area network (LAN), and FlexRay (registered trademark), for example.

Each control unit includes a microcomputer that performs arithmetic processing according to various programs, a storage unit that stores a program executed by the microcomputer or parameters used for various arithmetic operations, and a drive circuit that drives various devices to be controlled. Each control unit includes a network I/F for communicating with other control units through the communication network 7010, and a communication I/F for communicating with devices, sensors, or the like inside or outside the vehicle by wired communication or wireless communication. In FIG. 21, as the functional configuration of the integrated control unit 7600, a microcomputer 7610, a general-purpose communication I/F 7620, a dedicated communication I/F 7630, a positioning unit 7640, a beacon receiving unit 7650, an in-vehicle device I/F 7660, an audio image output unit 7670, an in-vehicle network I/F 7680, and a storage unit 7690 are illustrated. The other control units similarly include a microcomputer, a communication I/F, a storage unit, and the like.

The drive system control unit 7100 controls the operation of devices related to the drive system of the vehicle according to various programs. For example, the drive system control unit 7100 functions as a controller of a drive force generation device for generating a drive force of a vehicle such as an internal combustion engine or a drive motor, a drive force transmission mechanism for transmitting the drive force to wheels, a steering mechanism that adjusts the steering angle of the vehicle, a braking device that generates a braking force of the vehicle, and the like. The drive system control unit 7100 may have a function as a controller such as an antilock brake system (ABS) or an electronic stability control (ESC).

A vehicle state detection unit 7110 is connected to the drive system control unit 7100. The vehicle state detection unit 7110 includes, for example, at least one of a gyro sensor that detects the angular velocity of the shaft rotational movement of the vehicle body, an acceleration sensor that detects the acceleration of the vehicle, or a sensor for detecting an accelerator pedal operation amount, a brake pedal operation amount, a steering wheel steering angle, an engine speed, a wheel rotation speed, or the like. The drive system control unit 7100 performs arithmetic processing using a signal input from the vehicle state detection unit 7110 to control an internal combustion engine, a drive motor, an electric power steering device, a brake device, or the like.

The body system control unit 7200 controls the operation of various devices equipped on the vehicle body according to various programs. For example, the body system control unit 7200 functions as a controller of a keyless entry system, a smart key system, a power window device, or various lamps such as a headlamp, a back lamp, a brake lamp, a blinker, or a fog lamp. In this case, the body system control unit 7200 may receive input of radio waves transmitted from a portable device substituting a key or signals of various switches. The body system control unit 7200 receives input of these radio waves or signals, and controls a door lock device, a power window device, a lamp, and the like of the vehicle.

The battery control unit 7300 controls a secondary battery 7310 that is the power supply source of the drive motor according to various programs. For example, the battery control unit 7300 receives input of information such as the battery temperature, the battery output voltage, or the remaining capacity of the battery from a battery device including the secondary battery 7310. The battery control unit 7300 performs arithmetic processing using these signals to control the temperature adjustment of the secondary battery 7310 or control a cooling device or the like provided in the battery device.

The outside information detection unit 7400 detects information outside the vehicle equipped with the vehicle control system 7000. For example, at least one of an imaging unit 7410 or an outside information detection portion 7420 is connected to the outside information detection unit 7400. The imaging unit 7410 includes at least one of a time of flight (ToF) camera, a stereo camera, a monocular camera, an infrared camera, or other cameras. The outside information detection portion 7420 includes at least one of an environment sensor for detecting the current weather, or an ambient information detection sensor for detecting another vehicle around the vehicle equipped with the vehicle control system 7000, an obstacle, a pedestrian, or the like, for example.

The environment sensor may be at least one of a raindrop sensor that detects rainy weather, a fog sensor that detects fog, a sunshine sensor that detects the degree of sunshine, or a snow sensor that detects snowfall, for example. The ambient information detection sensor may be at least one of an ultrasonic sensor, a radar device, or a light detection and ranging or laser imaging detection and ranging (LIDAR) device, for example. The imaging unit 7410 and the outside information detection portion 7420 may be provided as independent sensors or devices, or may be provided as a device in which multiple sensors or devices are integrated.

Figure 22:
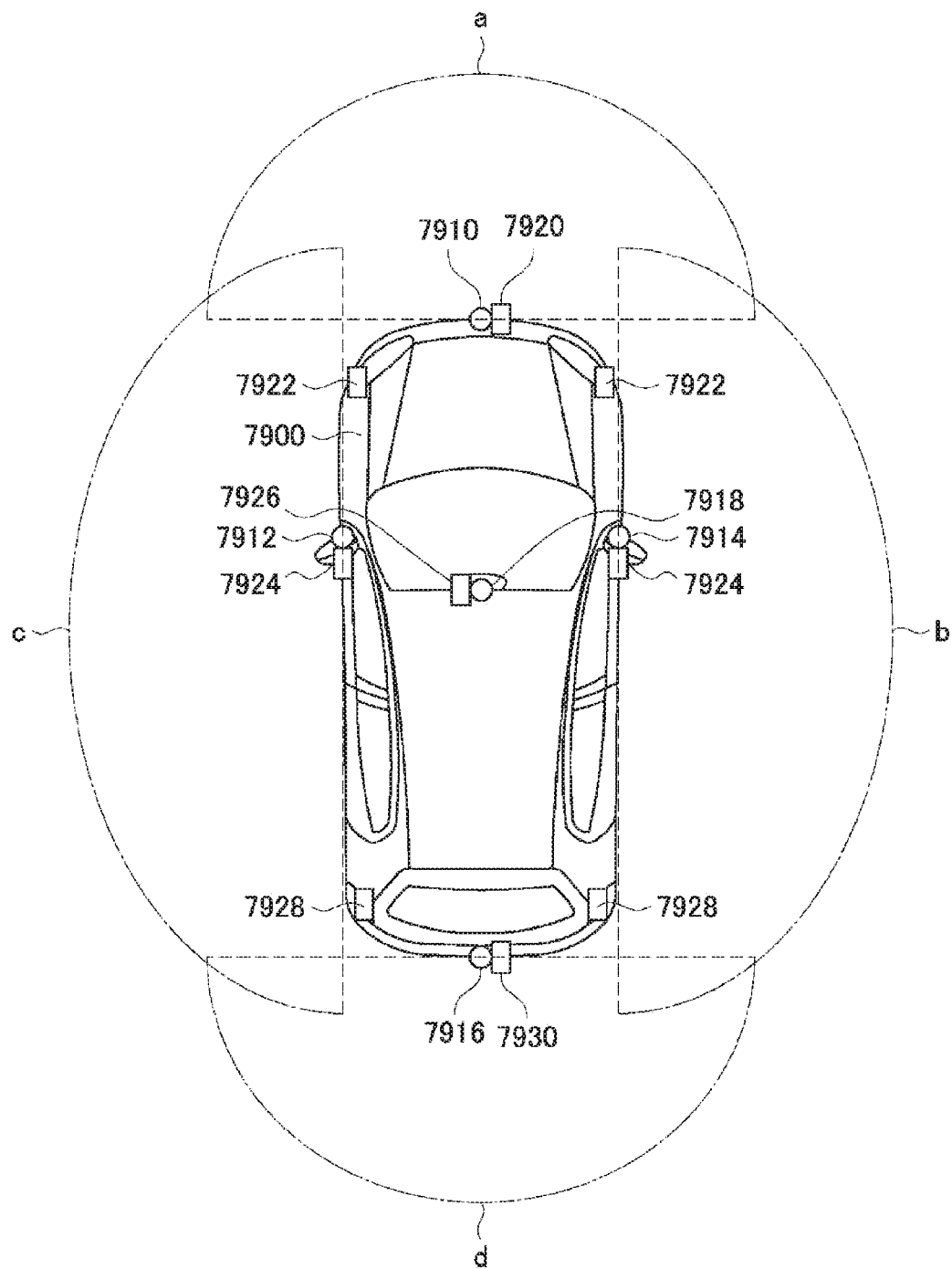
FIG. 22 is an explanatory diagram showing an example of installation positions of an outside information detection portion and an imaging unit.

Here, FIG. 22 shows an example of the installation positions of the imaging unit 7410 and the outside information detection portion 7420. For example, imaging units 7910, 7912, 7914, 7916, and 7918 are provided in at least one of positions of a front nose, a side mirror, a rear bumper, a back door, and an upper portion of a windshield in the vehicle interior of a vehicle 7900. The imaging unit 7910 provided on the front nose and the imaging unit 7918 provided on the upper portion of the windshield in the vehicle interior mainly acquire images of the front of the vehicle 7900. The imaging units 7912 and 7914 provided on the side mirrors mainly acquire images of the sides of the vehicle 7900. The imaging unit 7916 provided in the rear bumper or the back door mainly acquires an image of the rear of the vehicle 7900. The imaging unit 7918 provided on the upper portion of the windshield in the vehicle interior is mainly used to detect a preceding vehicle or a pedestrian, an obstacle, a traffic light, a traffic sign, a lane, or the like.

Note that FIG. 22 shows an example of the imaging ranges of the imaging units 7910, 7912, 7914, and 7916. An imaging range a indicates the imaging range of the imaging unit 7910 provided on the front nose, imaging ranges b and c indicate the imaging ranges of the imaging units 7912 and 7914 provided on the side mirrors, respectively, and an imaging range d indicates the imaging range of the imaging unit 7916 provided on the rear bumper or the back door. For example, by superimposing the pieces of image data captured by the imaging units 7910, 7912, 7914, and 7916, a bird's eye view image of the vehicle 7900 as viewed from above can be obtained.

Outside information detection portions 7920, 7922, 7924, 7926, 7928, and 7930 provided on the front, rear, sides, corners, and the upper portion of the windshield in the vehicle interior of the vehicle 7900 may be ultrasonic sensors or radar devices, for example. The outside information detection portions 7920, 7926, and 7930 provided on the front nose, the rear bumper, the back door, and the upper portion of the windshield in the vehicle interior of the vehicle 7900 may be LIDAR devices, for example. These outside information detection portions 7920 to 7930 are mainly used for detecting a preceding vehicle, a pedestrian, an obstacle, or the like.

Returning to FIG. 21, the description will be continued. The outside information detection unit 7400 causes the imaging unit 7410 to capture an image of the outside of the vehicle, and receives the captured image data. Additionally, the outside information detection unit 7400 also receives detection information from the outside information detection portion 7420 connected thereto. In a case where the outside information detection portion 7420 is an ultrasonic sensor, a radar device, or a LIDAR device, the outside information detection unit 7400 causes transmission of ultrasonic waves, electromagnetic waves, or the like, and receives information on the received reflected waves. The outside information detection unit 7400 may perform object detection processing or distance detection processing of a person, a vehicle, an obstacle, a sign, characters on a road surface, or the like on the basis of the received information. The outside information detection unit 7400 may perform environment recognition processing for recognizing rainfall, fog, road surface conditions, or the like on the basis of the received information. The outside information detection unit

7400 may calculate the distance to the object outside the vehicle on the basis of the received information.

Additionally, the outside information detection unit 7400 may perform object recognition processing or distance detection processing of a person, a vehicle, an obstacle, a sign, characters on a road surface, or the like on the basis of the received image data. The outside information detection unit 7400 may perform processing such as distortion correction or position adjustment on the received image data, combine image data captured by different imaging units 7410, and generate a bird's eye view image or a panoramic image. The outside information detection unit 7400 may perform viewpoint conversion processing using image data captured by different imaging units 7410.

The inside information detection unit 7500 detects information inside the vehicle. For example, a driver state detection unit 7510 that detects a state of a driver is connected to the inside information detection unit 7500. The driver state detection unit 7510 may include a camera that images the driver, a biometric sensor that detects biometric information of the driver, a microphone that collects voice in the vehicle interior, and the like. For example, the biometric sensor is provided on a seat surface, a steering wheel, or the like, and detects biometric information of an occupant sitting in a seat or a driver who grips a steering wheel. The inside information detection unit 7500 may calculate the degree of fatigue or concentration of the driver or determine whether or not the driver is asleep, on the basis of detection information input from the driver state detection unit 7510. The inside information detection unit 7500 may perform processing such as noise canceling processing on the collected audio signal.

The integrated control unit 7600 controls overall operations in the vehicle control system 7000 according to various programs. An input unit 7800 is connected to the integrated control unit 7600. The input unit 7800 is implemented by a device such as a touch panel, a button, a microphone, a switch, or a lever on which an occupant can perform input operation, for example. The integrated control unit 7600 may receive input of data obtained by voice recognition of voice input by a microphone. The input unit 7800 may be a remote control device using infrared rays or other radio waves, or an external connection device such as a mobile phone or a personal digital assistant (PDA) compatible with the operation of the vehicle control system 7000, for example. The input unit 7800 may be a camera, for example, in which case the occupant can input information by gesture. Alternatively, data obtained by detecting the movement of a wearable device worn by the occupant may be input. Moreover, the input unit 7800 may include an input control circuit or the like that generates an input signal on the basis of information input by the occupant or the like using the above input unit 7800, and outputs the input signal to the integrated control unit 7600, for example. By operating the input unit 7800, the occupant or the like inputs various data or gives an instruction on a processing operation to the vehicle control system 7000.

The storage unit 7690 may include a read only memory (ROM) that stores various programs executed by the microcomputer, and a random access memory (RAM) that stores various parameters, calculation results, sensor values, or the like. Additionally, the storage unit 7690 may be implemented by a magnetic storage device such as a hard disk drive (HDD), a semiconductor storage device, an optical storage device, a magneto-optical storage device, or the like.

The general-purpose communication I/F 7620 is a general-purpose communication I/F that mediates communication with various devices existing in an external environment 7750. The general-purpose communication I/F 7620 may implement a cellular communication protocol such as global system of mobile communications (GSM) (registered trademark), WiMAX, long term evolution (LTE) or LTE-advanced (LTE-A), or another wireless communication protocol such as wireless LAN (also referred to as Wi-Fi (registered trademark)) or Bluetooth (registered trademark). For example, the general-purpose communication I/F 7620 may connect to a device (e.g., application server or control server) existing in an external network (e.g., Internet, cloud network, or network unique to business operator) through a base station or an access point. Additionally, for example, the general-purpose communication I/F 7620 may connect with a terminal (e.g., terminal of driver, pedestrian, or store, or machine type communication (MTC) terminal) existing in the vicinity of the vehicle by using the peer to peer (P2P) technology.

The dedicated communication I/F 7630 is a communication I/F that supports a communication protocol designed for use in a vehicle. The dedicated communication I/F 7630 may implement wireless access in vehicle environment (WAVE), which is a combination of the lower layer IEEE802.11p and the upper layer IEEE1609, dedicated short range communications (DSRC), or a standard protocol such as a cellular communication protocol, for example. The dedicated communication I/F 7630 performs V2X communication, which is a concept that typically includes one or more of vehicle to vehicle communication, vehicle to infrastructure communication, vehicle to home communication, and vehicle to pedestrian communication.

For example, the positioning unit 7640 receives a global navigation satellite system (GNSS) signal from a GNSS satellite (e.g., (global positioning system (GPS) signal from GPS satellite) to perform positioning and generate position information including the latitude, longitude, and altitude of the vehicle. Note that the positioning unit 7640 may specify the current position by exchanging signals with a wireless access point, or may acquire position information from a terminal such as a mobile phone, a PHS, or a smartphone having a positioning function.

The beacon receiving unit 7650 receives radio waves or electromagnetic waves transmitted from a radio station or the like installed on the road, and acquires information such as current location, traffic congestion, traffic restrictions, or required time, for example. Note that the function of the beacon receiving unit 7650 may be included in dedicated communication I/F 7630 described above.

The in-vehicle device I/F 7660 is a communication interface that mediates connection between the microcomputer 7610 and various in-vehicle devices 7760 existing in the vehicle. The in-vehicle device I/F 7660 may establish a wireless connection using a wireless communication protocol such as wireless LAN, Bluetooth (registered trademark), near field communication (NFC), or Wireless USB (WUSB). Additionally, the in-vehicle device I/F 7660 may establish a wired connection such as universal serial bus (USB), high-definition multimedia interface (HDMI) (registered trademark), mobile high-definition link (MHL), or the like through a connection terminal (and, if necessary, a cable) not shown. The in-vehicle device 7760 may include at least one of a mobile device or a wearable device that an occupant owns, or an information device that is carried in or attached to the vehicle, for example. Additionally, the in-vehicle device 7760 may include a navigation device that searches for a route to an arbitrary destination. The in-vehicle device I/F 7660 exchanges control signals or data signals with these in-vehicle devices 7760.

The in-vehicle network I/F 7680 is an interface that mediates communication between the microcomputer 7610 and the communication network 7010. The in-vehicle network I/F 7680 transmits and receives signals and the like according to a predetermined protocol supported by the communication network 7010.

The microcomputer 7610 of the integrated control unit 7600 controls the vehicle control system 7000 according to various programs, on the basis of information acquired through at least one of the general-purpose communication I/F 7620, the dedicated communication I/F 7630, the positioning unit 7640, the beacon receiving unit 7650, the in-vehicle device I/F 7660, or the in-vehicle network I/F 7680. For example, the microcomputer 7610 may calculate a control target value of the drive force generation device, the steering mechanism, or the braking device on the basis of acquired information on the inside and outside of the vehicle, and output a control command to the drive system control unit 7100. For example, the microcomputer 7610 can perform coordinated control aimed to achieve functions of an advanced driver assistance system (ADAS) including collision avoidance or shock mitigation of a vehicle, follow-up traveling based on an inter-vehicle distance, vehicle speed maintenance traveling, vehicle collision warning, vehicle lane departure warning, or the like. Additionally, the microcomputer 7610 may control the drive force generation device, the steering mechanism, the braking device, or the like on the basis of acquired information on the surrounding of the vehicle, to perform coordinated control aimed for automatic driving of traveling autonomously without depending on the driver's operation, for example.

The microcomputer 7610 may generate, on the basis of information acquired through at least one of the general-purpose communication I/F 7620, the dedicated communication I/F 7630, the positioning unit 7640, the beacon receiving unit 7650, the in-vehicle device I/F 7660, or the in-vehicle network I/F 7680, three-dimensional distance information between the vehicle and surrounding objects such as structures and persons, and create local map information including peripheral information of the current position of the vehicle. Additionally, the microcomputer 7610 may predict a risk of a vehicle collision, proximity of a pedestrian or the like, entry into a closed road, or the like on the basis of the acquired information, and generate a warning signal. The warning signal may be a signal for sounding a warning sound or lighting a warning lamp, for example.

The audio image output unit 7670 transmits an output signal of at least one of audio or an image to an output device capable of visually or aurally giving notification of information to an occupant or the outside of the vehicle. In the example of FIG. 21, an audio speaker 7710, a display unit 7720, and an instrument panel 7730 are shown as examples of the output device. The display unit 7720 may include at least one of an onboard display or a head-up display, for example. The display unit 7720 may have an augmented reality (AR) display function. The output device may be a device other than these devices, such as headphones, a wearable device such as a glasses-type display worn by an occupant, a projector, or a lamp. In a case where the output device is a display device, the display device visually displays results obtained by various processing performed by the microcomputer 7610 or information received from another control unit in various formats such as text, images, tables, and graphs. Additionally, in a case where the output device is a voice output device, the voice output device converts an audio signal including reproduced voice data, acoustic data, or the like into an analog signal and outputs the analog signal audibly.

Note that, in the example shown in FIG. 21, at least two control units connected through the communication network 7010 may be integrated as one control unit. Alternatively, each control unit may include multiple control units. Moreover, the vehicle control system 7000 may include another control unit not shown. Additionally, in the above description, some or all of the functions of any control unit may be given to another control unit. That is, as long as information is transmitted and received through the communication network 7010, the predetermined arithmetic processing may be performed by any control unit. Similarly, a sensor or device connected to one of the control units may be connected to another control unit, and multiple control units may transmit and receive detection information to and from each other through the communication network 7010.

Of the configurations described above, the technology according to the present disclosure is applicable to the imaging unit of the outside information detection unit, for example.

While embodiments of the present disclosure have been specifically described above, the present disclosure is not limited to the above-described embodiments, and various modifications based on the technical idea of the present disclosure are possible. For example, the numerical values, structures, substrates, raw materials, processes, and the like mentioned in the above embodiments are merely examples, and different numerical values, structures, substrates, raw materials, processes, and the like may be used as necessary.

Configuration of Present Disclosure

Note that the technology of the present disclosure can also be configured in the following manner.

[A1]

An imaging device including:
a wiring substrate;
an image sensor package mounted on the wiring substrate;
a package frame attached to a light receiving surface side of the image sensor package; and
a lens holder arranged to cover the package frame and holding a lens unit so that the lens unit faces the light receiving surface of the image sensor package, in which
the package frame includes a material having a larger coefficient of linear expansion than a material of the lens holder, and includes a wall portion that extends in a direction perpendicular to the wiring substrate toward the wiring substrate,
a gap is provided between the wall portion of the package frame and the image sensor package, and between an end of the wall portion of the package frame and the wiring substrate,
the lens holder includes a wall portion facing the wall portion of the package frame, and
an end of the wall portion of the lens holder is fixed to the end of the wall portion of the package frame while being separated from the wiring substrate.

[A2]

The imaging device according to [A1] above, in which the material of the package frame and a length of the wall portion of the package frame extending in the direction perpendicular to the wiring substrate, and the material of the lens holder and a length of the wall portion of the lens holder extending in the direction perpendicular to the wiring substrate are selected, so that a distance between the light receiving surface of the image sensor package and the lens unit is kept constant regardless of an ambient temperature.

[A3]

The imaging device according to [A1] above, in which the material of the package frame and a length of the wall portion of the package frame extending in the direction perpendicular to the wiring substrate, and the material of the lens holder and a length of the wall portion of the lens holder extending in the direction perpendicular to the wiring substrate are set, so that a distance between the light receiving surface of the image sensor package and the lens unit changes with a predetermined sensitivity according to an ambient temperature.

[A4]

The imaging device according to [A3] above, in which the change in the distance between the light receiving surface of the image sensor package and the lens unit with the predetermined sensitivity according to the ambient temperature compensates for an influence of a characteristic change of the lens unit that occurs according to the ambient temperature.

[A5]

The imaging device according to any one of [A1] to [A4] above, in which the package frame includes a resin material.

[A6]

The imaging device according to any one of [A1] to [A5] above, in which the lens holder includes a metal material.

[A7]

The imaging device according to any one of [A1] to [A6] above, in which a lens included in the lens unit includes a glass material or a plastic material.

[A8]

The imaging device according to any one of [A1] to [A7] above, in which a cushion member is arranged between the end of the wall portion of the lens holder and the wiring substrate.

[A9]

The imaging device according to [A8] above, in which the cushion member includes a sponge material.

[A10]

The imaging device according to any one of [A1] to [A9] above, in which the end of the wall portion of the lens holder is fixed to a surface of a flange provided on the end of the wall portion of the package frame.

[A11]

The imaging device according to any one of [A1] to [A9] above, in which a side surface near the end of the wall portion of the lens holder is fixed to a side surface near the end of the wall portion of the package frame.

[A12]

The imaging device according to any one of [A1] to [A9] above, in which a side surface near the end of the wall portion of the lens holder is fixed to a side surface near the end of the wall portion of the package frame by a fixing member.

[A13]

The imaging device according to any one of [A1] to [A9] above, in which a side surface near the end of the wall portion of the lens holder is fixed to a side surface near the end of the wall portion of the package frame by fitting.

[A14]

The imaging device according to any one of [A1] to [A9] above, in which a step for setting a mounting position of the lens holder is provided near the end of the wall portion of the package frame.

REFERENCE SIGNS LIST 1, 9 Imaging device
10 Lens unit
11, 11A, 11B Lens
12 Lens barrel
20 Lens holder
21 Wall portion of lens holder
30 Package frame
31 Wall portion of package frame
40 Image sensor package
41 Seal glass
42 Sealing member
43 Image sensor
44 Package substrate
50 Solder bump
60 Wiring substrate

The invention claimed is:

1. An imaging device, comprising:
a wiring substrate;
an image sensor package mounted on the wiring substrate;
a package frame attached to a light receiving surface side of the image sensor package; and
a lens holder arranged to:
  cover the package frame, and
  hold a lens unit so that the lens unit faces the light receiving surface of the image sensor package, wherein
the package frame includes a material having a larger coefficient of linear expansion than a material of the lens holder, and includes a wall portion that extends in a direction perpendicular to the wiring substrate toward the wiring substrate,
a gap is provided between the wall portion of the package frame and the image sensor package, and between an end of the wall portion of the package frame and the wiring substrate,
the lens holder includes a wall portion facing the wall portion of the package frame, and
an end of the wall portion of the lens holder is fixed to the end of the wall portion of the package frame while being separated from the wiring substrate.

2. The imaging device according to claim 1, wherein the material of the package frame and a length of the wall portion of the package frame extending in the direction perpendicular to the wiring substrate, and the material of the lens holder and a length of the wall portion of the lens holder extending in the direction perpendicular to the wiring substrate are selected, so that a distance between the light receiving surface of the image sensor package and the lens unit is kept constant regardless of an ambient temperature.

3. The imaging device according to claim 1, wherein the material of the package frame and a length of the wall portion of the package frame extending in the direction perpendicular to the wiring substrate, and the material of the lens holder and a length of the wall portion of the lens holder extending in the direction perpendicular to the wiring substrate are set, so that a distance between the light receiving surface of the image sensor package and the lens unit changes with a specific sensitivity according to an ambient temperature.

4. The imaging device according to claim 3, wherein the change in the distance between the light receiving surface of the image sensor package and the lens unit with the specific sensitivity according to the ambient temperature compensates for an influence of a characteristic change of the lens unit that occurs according to the ambient temperature.

5. The imaging device according to claim 1, wherein the package frame includes a resin material.

6. The imaging device according to claim 1, wherein the lens holder includes a metal material.

7. The imaging device according to claim 1, wherein a lens included in the lens unit includes a glass material or a plastic material.

8. The imaging device according to claim 1, wherein a cushion member is arranged between the end of the wall portion of the lens holder and the wiring substrate.

9. The imaging device according to claim 8, wherein the cushion member includes a sponge material.

10. The imaging device according to claim 1, wherein the end of the wall portion of the lens holder is fixed to a surface of a flange provided on the end of the wall portion of the package frame.

11. The imaging device according to claim 1, wherein a side surface near the end of the wall portion of the lens holder is fixed to a side surface near the end of the wall portion of the package frame.

12. The imaging device according to claim 1, wherein a side surface near the end of the wall portion of the lens holder is fixed to a side surface near the end of the wall portion of the package frame by a fixing member.

13. The imaging device according to claim 1, wherein a side surface near the end of the wall portion of the lens holder is fixed to a side surface near the end of the wall portion of the package frame by fitting.

14. The imaging device according to claim 1, wherein a step for setting a mounting position of the lens holder is provided near the end of the wall portion of the package frame.

* * * * *